(12) United States Patent
Yamasaki et al.

(10) Patent No.: US 7,908,964 B2
(45) Date of Patent: Mar. 22, 2011

(54) SCREEN PRINTING APPARATUS AND SCREEN PRINTING METHOD

(75) Inventors: Kimiyuki Yamasaki, Fukuoka (JP); Seikou Abe, Fukuoka (JP); Takahiro Fukagawa, Fukuoka (JP)

(73) Assignee: Panasonic Corporation, Osaka (JP)

( * ) Notice: Subject to any disclaimer, the term of this patent is extended or adjusted under 35 U.S.C. 154(b) by 392 days.

(21) Appl. No.: 12/090,653

(22) PCT Filed: Nov. 10, 2006

(86) PCT No.: PCT/JP2006/322905
§ 371 (c)(1),
(2), (4) Date: Apr. 18, 2008

(87) PCT Pub. No.: WO2007/055413
PCT Pub. Date: May 18, 2007

(65) Prior Publication Data
US 2009/0133595 A1 May 28, 2009

(30) Foreign Application Priority Data

Nov. 11, 2005 (JP) .................................. 2005-327218

(51) Int. Cl.
*B05C 17/06* (2006.01)
(52) U.S. Cl. .................. 101/126; 101/486; 101/DIG. 36
(58) Field of Classification Search .................. 101/114, 101/123, 126, 129, 484, 485, 486, DIG. 36
See application file for complete search history.

(56) References Cited

U.S. PATENT DOCUMENTS

| 5,459,941 | A | * | 10/1995 | Lowe ............................... 33/620 |
| 5,730,051 | A | * | 3/1998 | Takahashi et al. ............. 101/126 |
| 5,752,446 | A | * | 5/1998 | Squibb ........................... 101/486 |
| 6,338,297 | B1 | * | 1/2002 | Wang et al. .................... 101/126 |
| 6,347,583 | B1 | * | 2/2002 | Isogai et al. ................... 101/126 |
| 6,490,970 | B2 | * | 12/2002 | Murakami .................... 101/126 |
| 6,621,517 | B1 | * | 9/2003 | Squibb ............................ 348/87 |
| 7,710,611 | B2 | * | 5/2010 | Prince .......................... 358/3.29 |

FOREIGN PATENT DOCUMENTS

| CN | 1401210 A | 3/2003 |
| DE | 3928527 | 3/1991 |
| JP | 08-156224 A | 6/1996 |
| JP | 09-323401 A | 12/1997 |
| JP | 11-245369 | 9/1999 |
| JP | 2001-038876 | 2/2001 |

(Continued)

OTHER PUBLICATIONS

International Search Report Dated Feb. 16, 2007.

(Continued)

*Primary Examiner* — Ren Yan
(74) *Attorney, Agent, or Firm* — Pearne & Gordon LLP

(57) ABSTRACT

The clearance 'd' between a substrate 3 and a mask 2 can be reduced at the time of the position recognition by horizontally offsetting two recognition devices 53,54 for recognizing the substrate 3 and the mask 2. Therefore, since the ascending stroke of the substrate 3 can be shortened at the time of the position alignment to contact the rear face of the substrate 3 with the rear face of the mask 2, the position misalignment of the substrate in the horizontal direction caused by the raising is suppressed. Accordingly, it is possible to suppress the reduction of the position alignment accuracy with the mask 2.

17 Claims, 16 Drawing Sheets

FOREIGN PATENT DOCUMENTS

| | | |
|---|---|---|
| JP | 2003-094613 A | 4/2003 |
| WO | 9514575 | 6/1995 |
| WO | 01/63988 A1 | 8/2001 |
| WO | 02097534 | 12/2002 |
| WO | 2004082345 | 9/2004 |
| WO | 2007/056268 A1 | 5/2007 |

OTHER PUBLICATIONS

Chinese Office Action dated May 22, 2009.
UK Office Action.

* cited by examiner

SCREEN PRINTING APPARATUS AND SCREEN PRINTING METHOD

BACKGROUND OF THE INVENTION

1. Field of the Invention

The present invention relates to a screen printing apparatus and a screen printing method which print a pattern with paste on the surface of a substrate which is aligned with a mask in which predetermined pattern openings are formed.

2. Related Art

In a mounting process of electronic components, screen printing of supplying a pasted conductive material (conductive paste, hereinafter simply referred to as 'paste') onto the surface of a substrate is used frequently in order to mechanically and electrically join electronic components to the substrate. The screen printing includes supplying paste onto the surface of a mask provided with pattern openings formed in a predetermined pattern in a state where the mask is brought into surface contact with the surface of a substrate, and applying and spreading the paste on the surface of the mask by means of a squeegee which slides on the surface of the mask, thereby printing a pattern on the surface of the substrate with the paste stagnated in the pattern openings. Electronic components are placed on the part where a pattern is printed with the paste, and the electronic components are mounted on the substrate in a state where they are mechanically and electrically joined together with the paste cured through a reflow process.

In the screen printing, it is important to accurately print a paste at a predetermined position of the substrate surface and it is necessary to align the substrate with the mask in high precision. In the position alignment, the position misalignment is set as the displacement of the substrate to perform the position alignment compensation by photographing the positions of recognized parts respectively formed on the substrate and the mask with the recognition device including a camera, etc. (for example, refer to JP-A-2001-38876 and JP-A-11-245369).

In a screen printing apparatus disclosed in JP-A-2001-38876, respective recognized parts are photographed with one camera provided on both substrate and mask. By this configuration, when the recognized part of the substrate disposed on a lower side of the mask is photographed, it is necessary to draw out the substrate from the lower side of the mask. Therefore, it is necessary to secure a space for drawing out the mask, thereby causing the apparatus to be enlarged.

Meanwhile, in the screen printing apparatus disclosed in JP-A-11-245369, the recognition device including two cameras such as a camera photographing the recognized part formed on the surface of the substrate and a camera photographing the recognized part formed on the rear face of the mask is disposed between the substrate and the mask. By this configuration, it is possible to photograph the recognized part without drawing out the substrate, but it is necessary to increase the clearance between the substrate and the mask at the time of the position alignment since two cameras are vertically stacked to arrange the optical axes of the respective cameras on a same plumb line. As the result, the stroke raised to contact the substrate to the mask after the position alignment compensation becomes longer, whereby the position alignment accuracy of the substrate and the mask is reduced.

SUMMARY OF THE INVENTION

Therefore, the object of the invention is to provide a screen printing apparatus and a screen printing method for suppressing the deterioration of the position alignment accuracy of a substrate and a mask.

According to an aspect of the invention, a screen printing apparatus which prints a pattern with paste on the surface of a substrate aligned with a mask in which predetermined pattern openings are formed includes a substrate holding device holding the substrate moving device moving the substrate held on the substrate holding device and aligning the substrate with the mask; a recognition device recognizing a first recognized part formed on a surface of the substrate and a second recognized part formed on a rear face of the mask; and a moving device advancing and retreating the recognition device between the substrate and the mask and horizontally moving the recognition device in the range including the first recognized part and the second recognized part, wherein the recognition device includes a first recognition device which recognizes the first recognized part and a second recognition device which recognizes the second recognized part, and offsets the first recognition device and the second recognition device in a horizontal direction and arranges the first recognition device and the second recognition device in parallel.

According to another aspect of the invention, a screen printing method of printing a pattern with paste on the surface of a substrate aligned with a mask in which predetermined pattern openings are formed includes the steps of advancing and retreating a recognition device including a first recognition device and a second recognition device arranged in parallel by horizontal offset between the substrate and the mask; and horizontally moving the recognition device in a range including a first recognized part formed the surface of the substrate and a second recognized part formed the rear face of the mask, wherein the first recognition device recognizes the first recognized part on a lower side and the second recognition device recognizes the second recognized part on an upper side.

According to the invention, the clearance between a substrate and a mask is reduced at the time of the position recognition and the ascending stroke of the substrate is shortened at the time of the position alignment by horizontally offsetting two recognition devices which recognize the substrate and the mask and arranging the recognition device in parallel. Accordingly, it is possible to suppress the deterioration of the position alignment accuracy of the substrate and the mask.

DETAILED DESCRIPTION OF THE PREFERRED EMBODIMENTS

Figure 1:
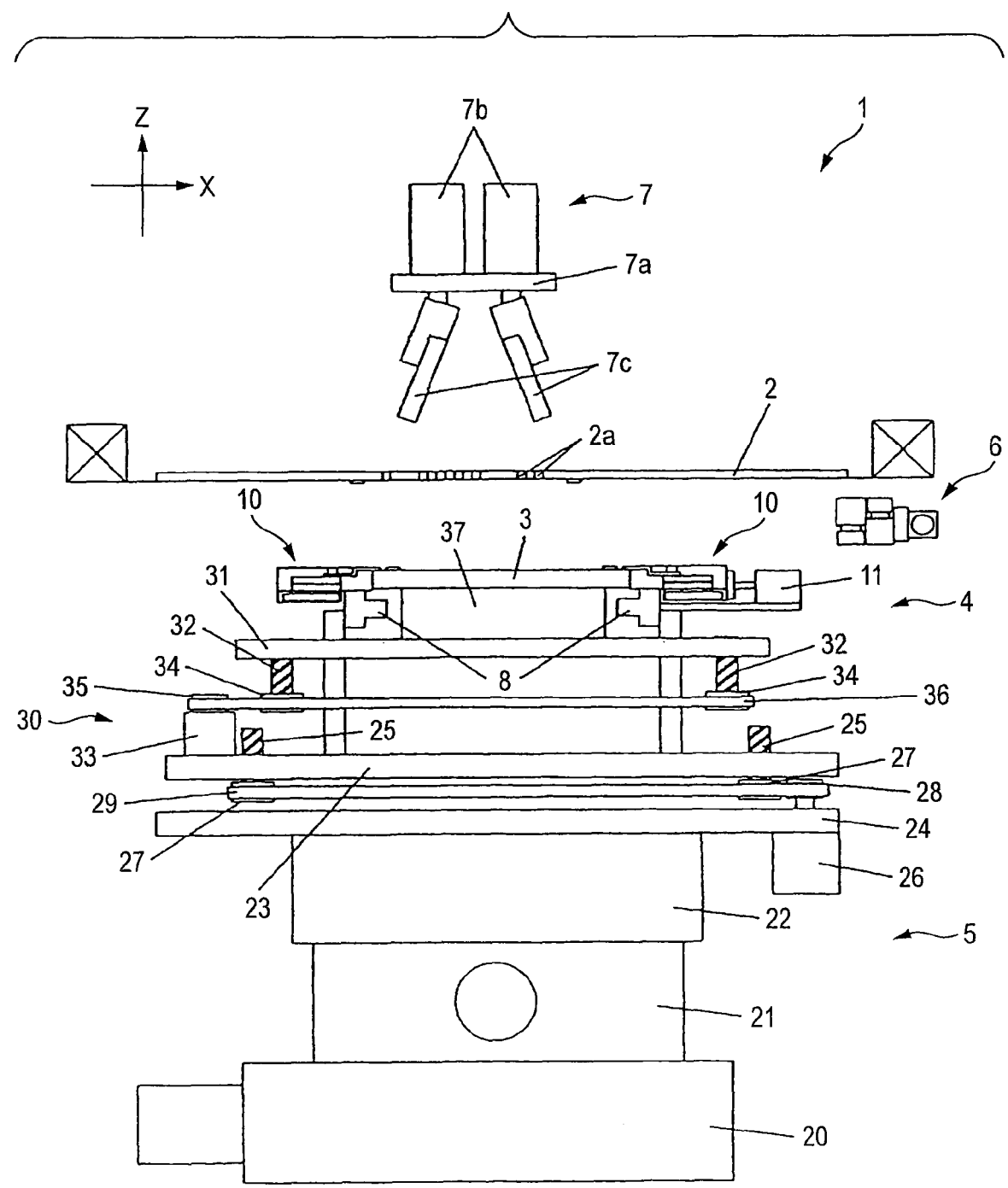
FIG. 1 is a side view of a screen printing apparatus according to one embodiment of the invention.
Figure 2:
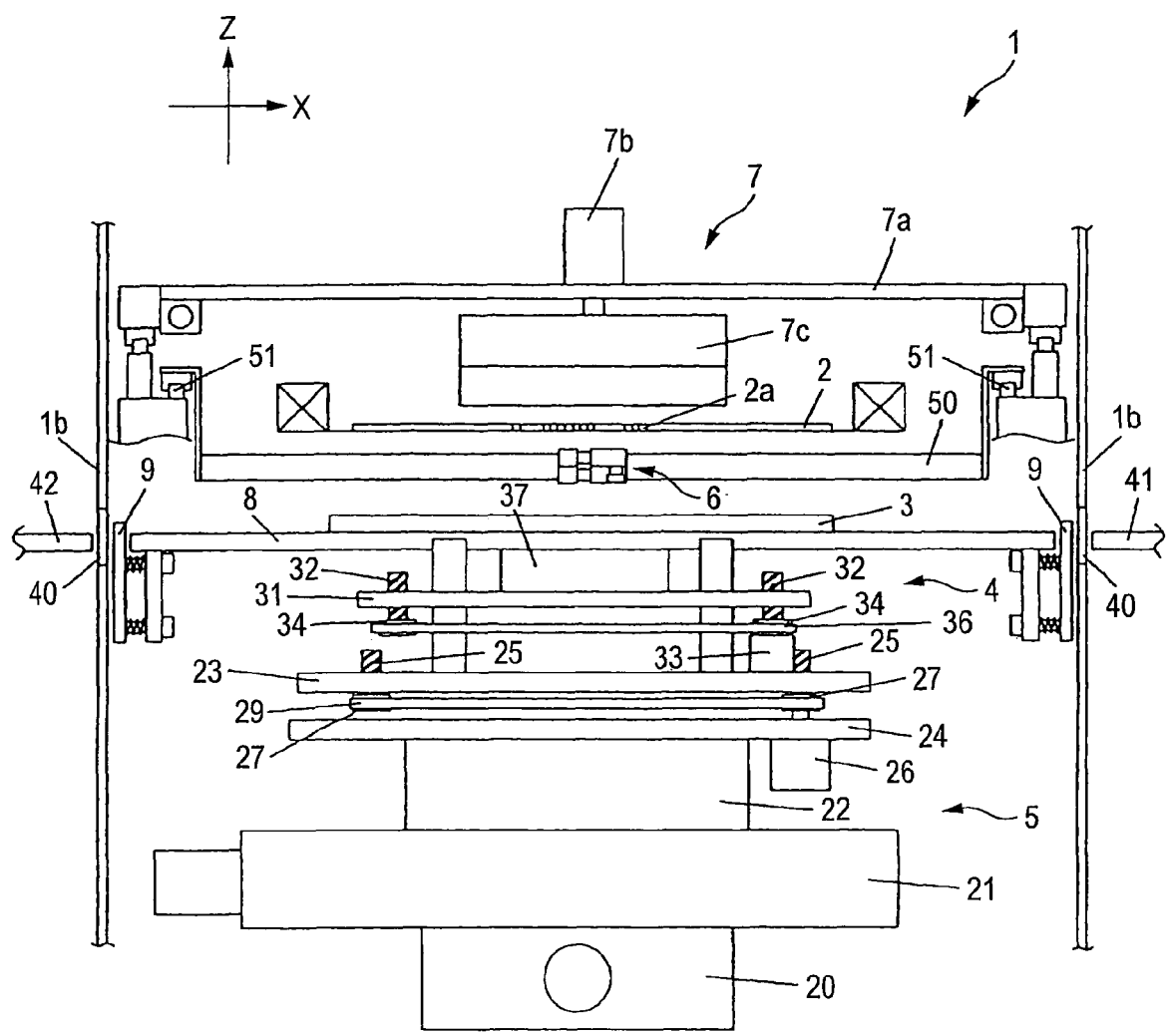
FIG. 2 is a front view of the screen printing apparatus according to one embodiment of the invention.
Figure 3A:
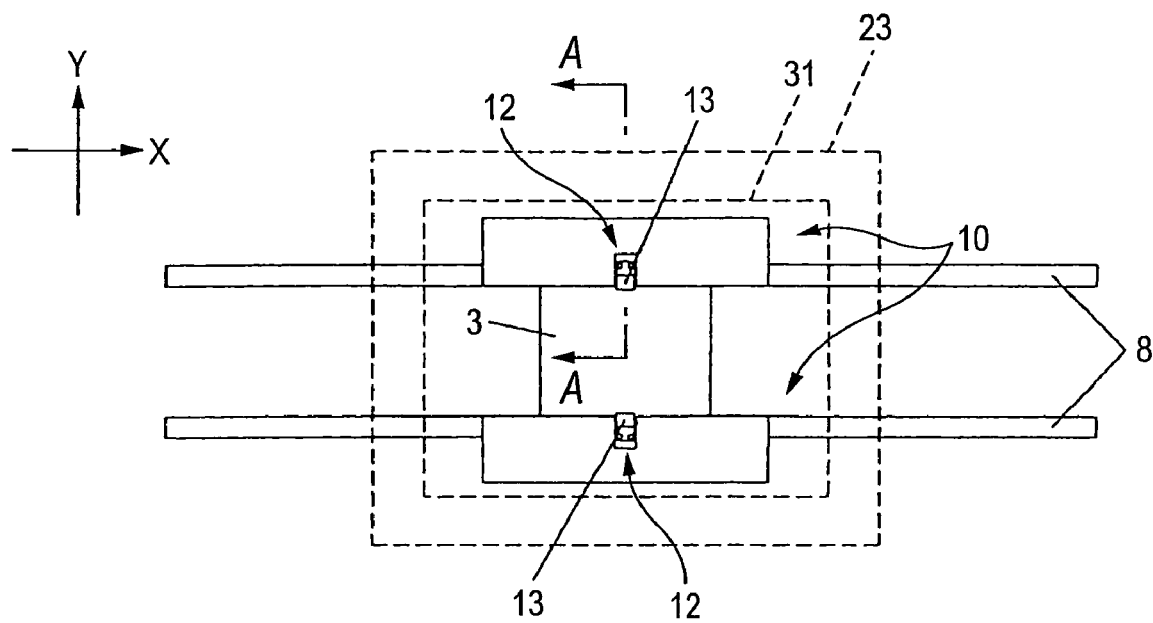
FIG. 3A is a plan view of a substrate supporter according to one embodiment of the invention.
Figure 3B:
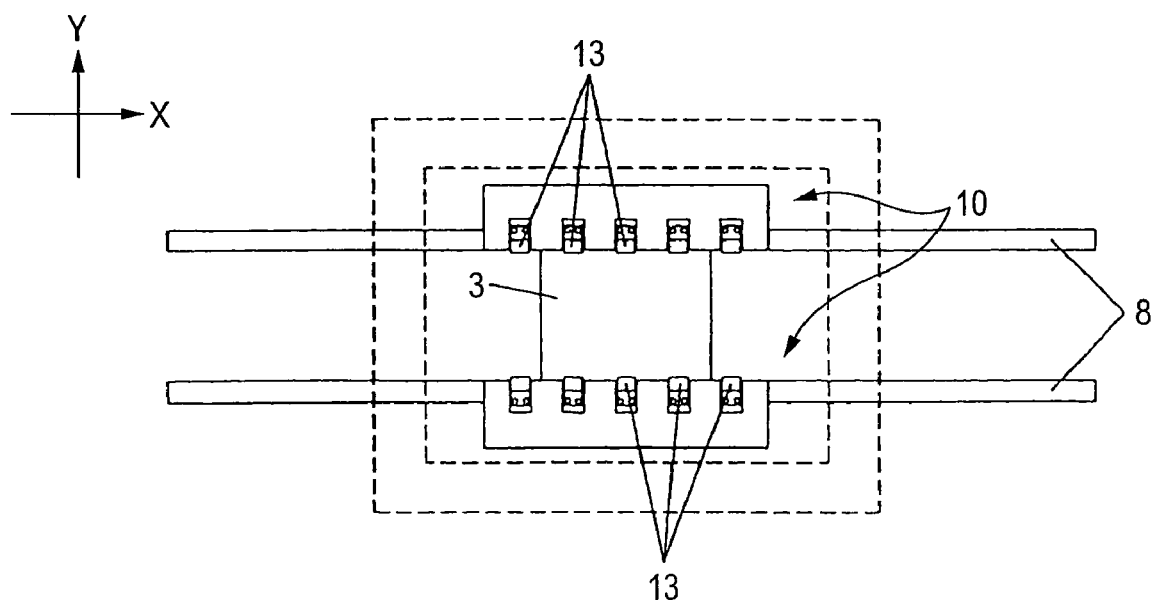
FIG. 3B is a plan view of the substrate supporter according to one embodiment of the invention.
Figure 4A:
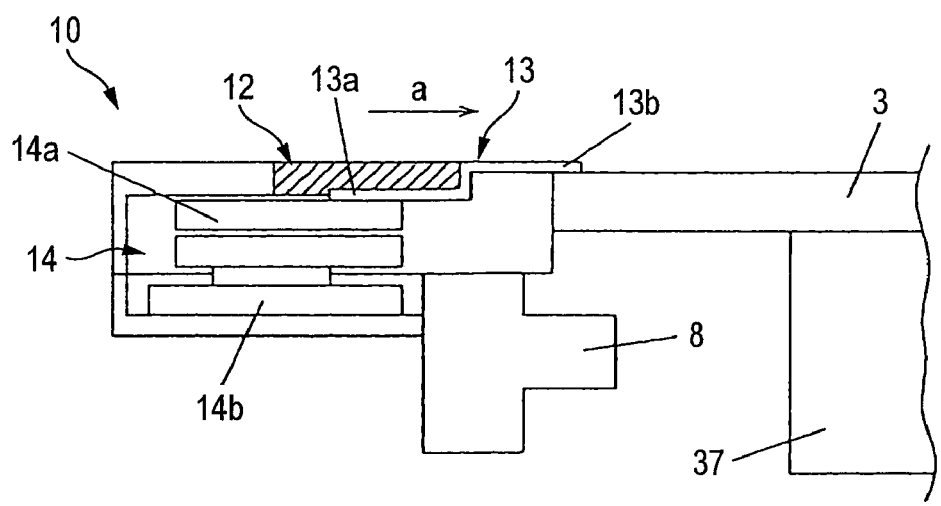
FIG. 4A is a partial side sectional view of the substrate supporter according to one embodiment of the invention.
Figure 4B:
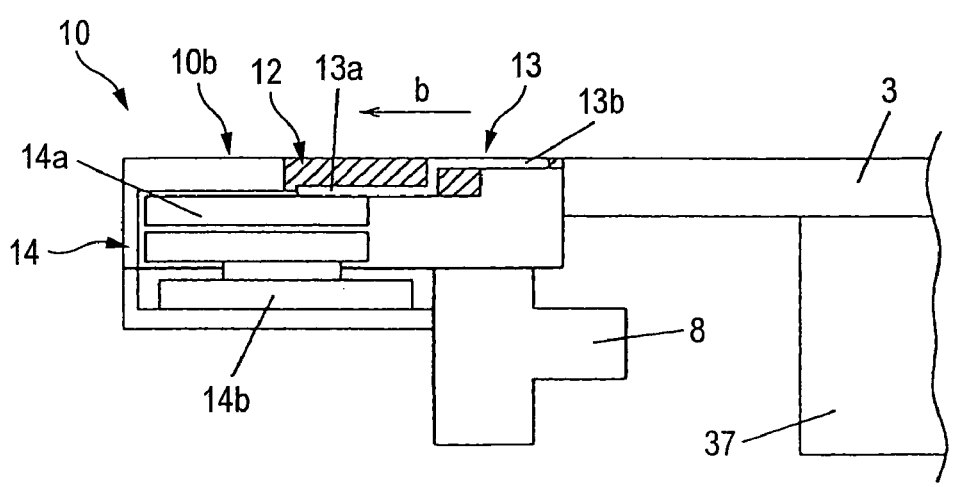
FIG. 4B is a partial side sectional view of the substrate supporter according to one embodiment of the invention.
Figure 4C:
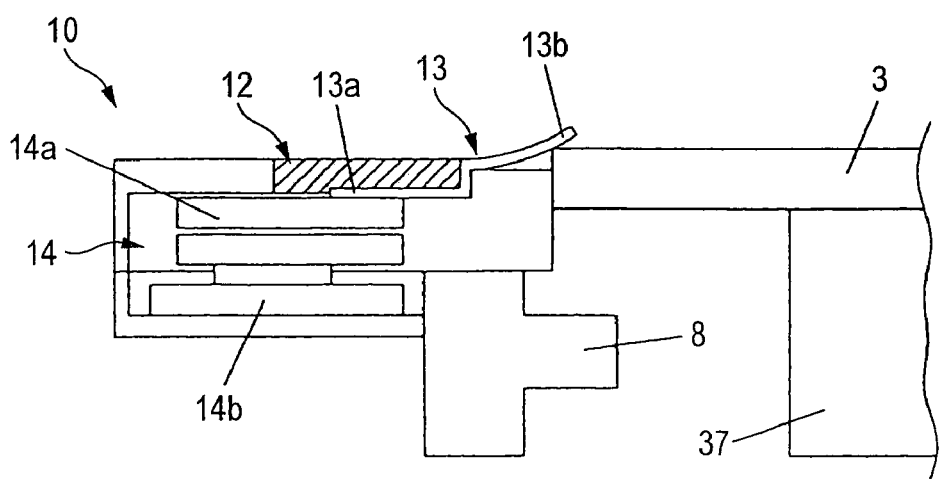
FIG. 4C is a partial side sectional view of the substrate supporter according to one embodiment of the invention.
Figure 5:
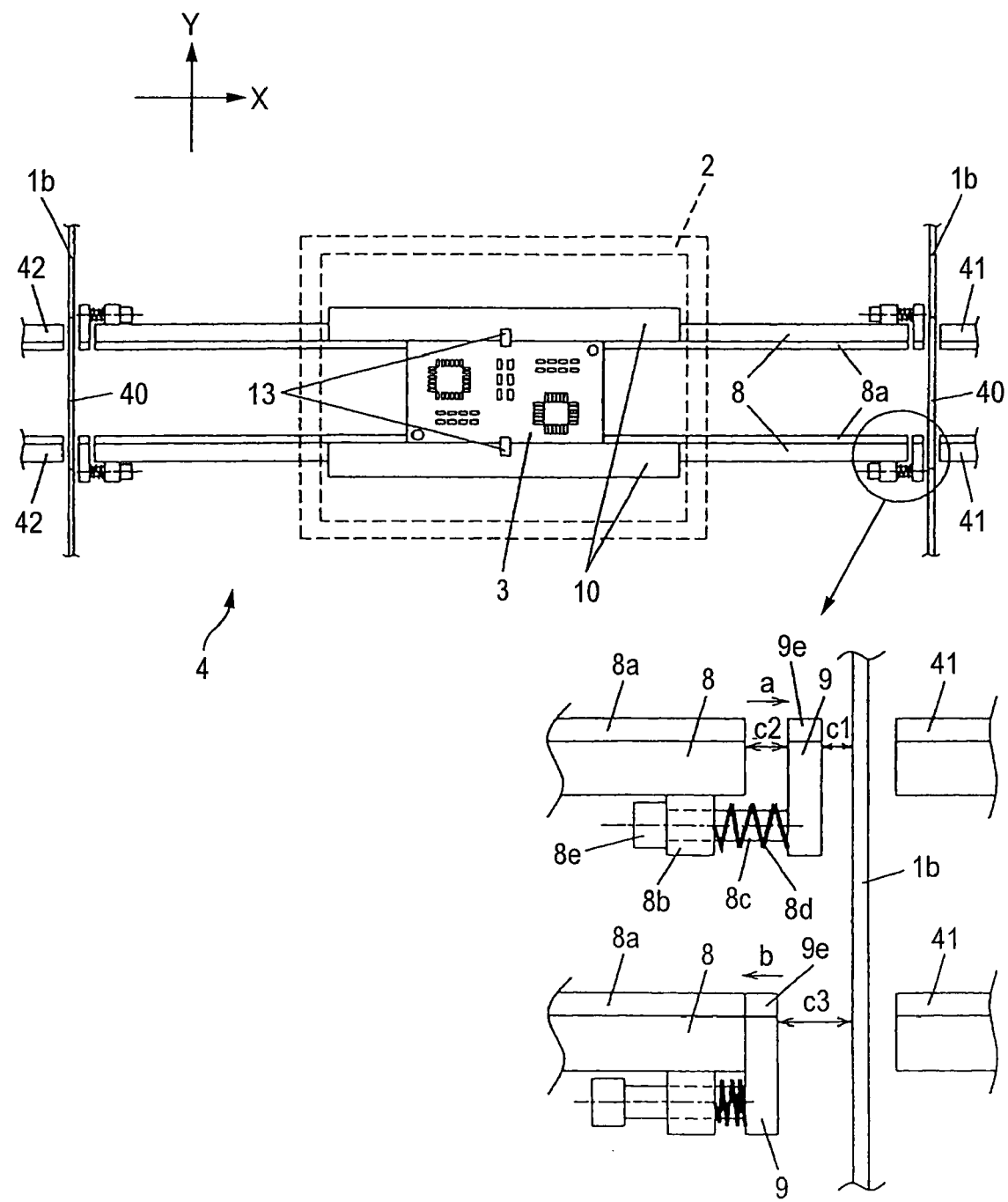
FIG. 5 is a plan view and partially enlarged plan view of the substrate supporter according to one embodiment of the invention.
Figure 6A:
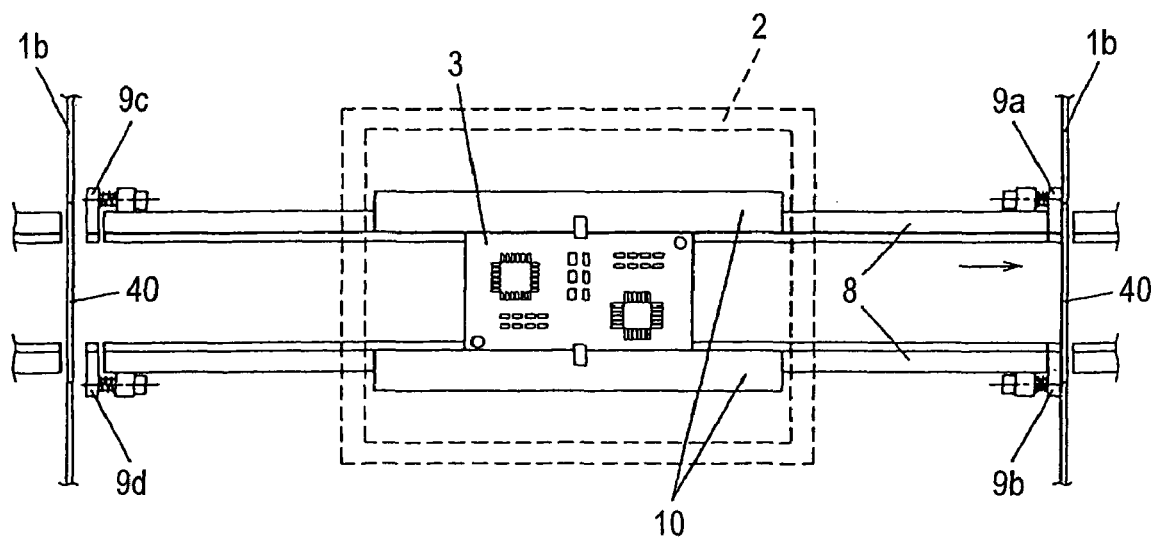
FIG. 6A is an explanatory view of the operation of the substrate supporter according to one embodiment of the invention.
Figure 6B:
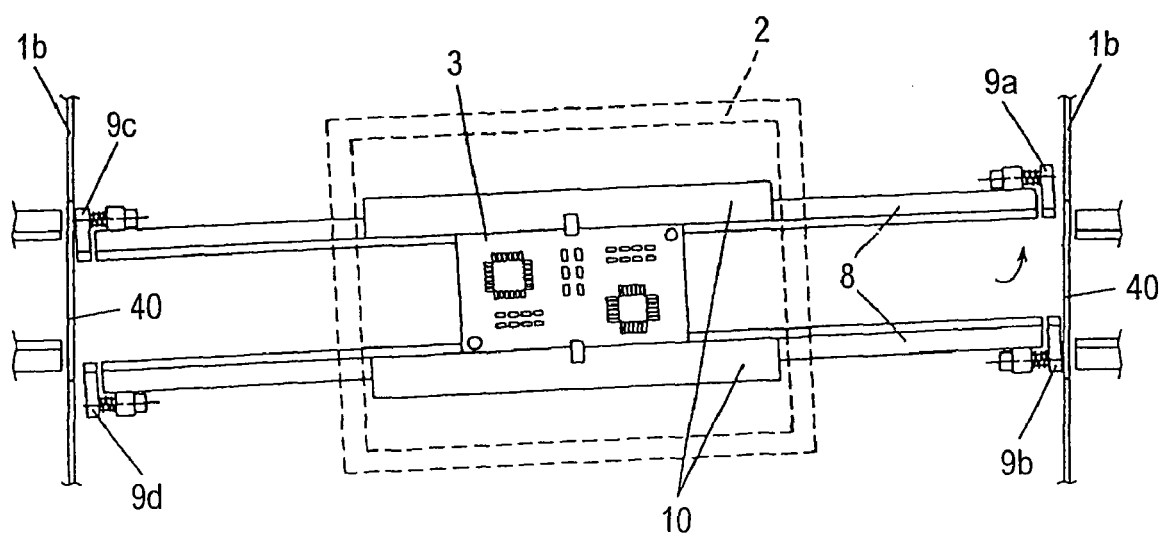
FIG. 6B is an explanatory view of the operation of the substrate supporter according to one embodiment of the invention.
Figure 7A:
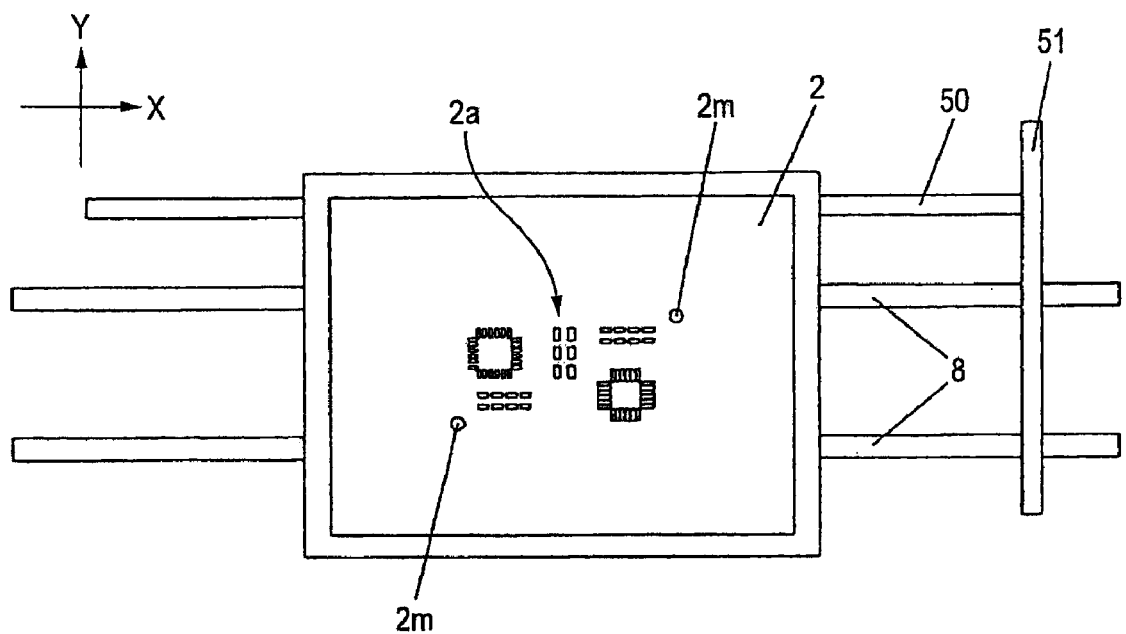
FIG. 7A is a plan view showing the positional relationship among a mask, a substrate, and a recognition device according to one embodiment of the invention.
Figure 7B:
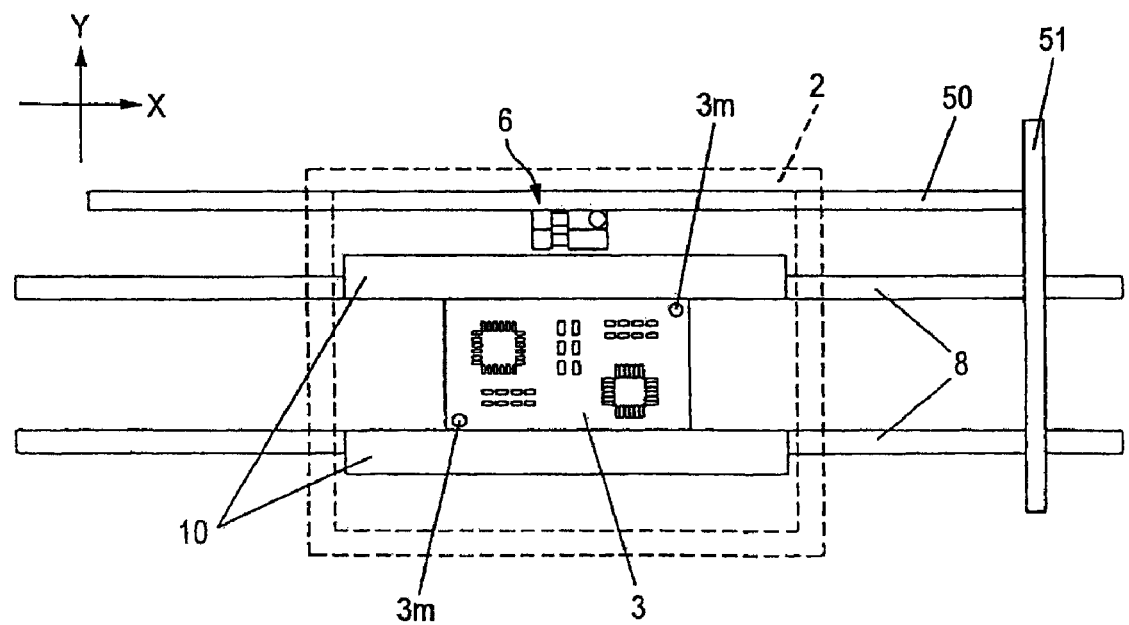
FIG. 7B is a plan view showing the positional relationship among the mask, the substrate, and the recognition device according to one embodiment of the invention.
Figure 8A:
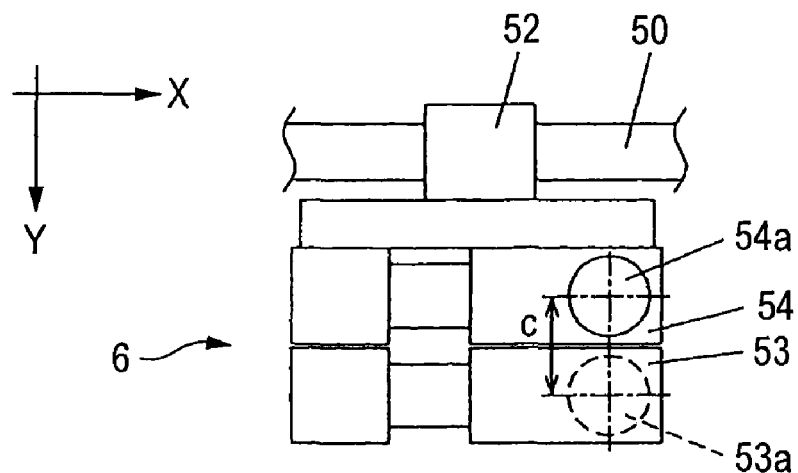
FIG. 8A is a plan view of the recognition device according to one embodiment of the invention.
Figure 8B:
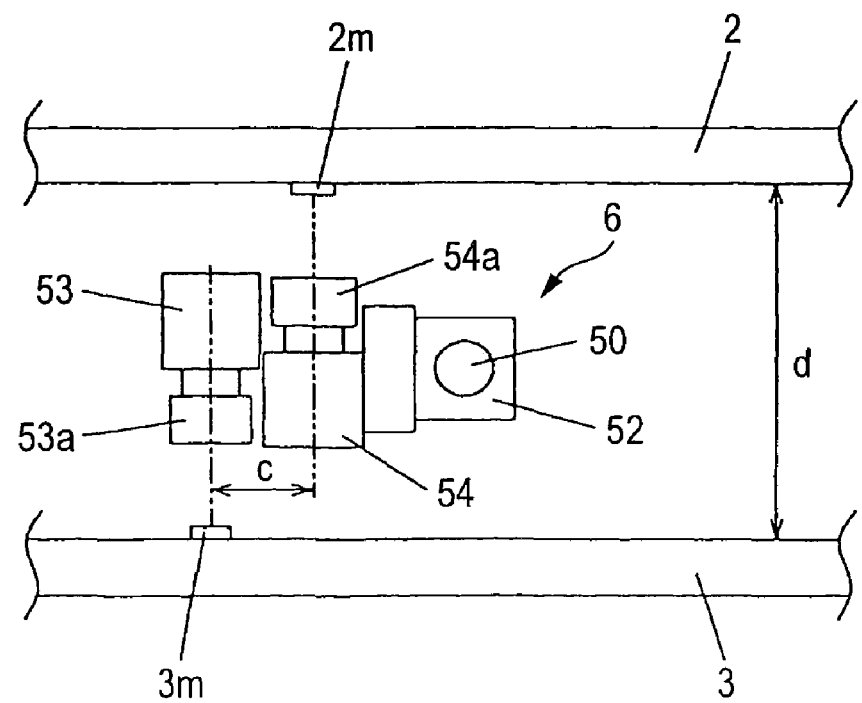
FIG. 8B is a side view showing the positional relationship among the mask, the substrate, and the recognition device according to one embodiment of the invention.
Figure 9:
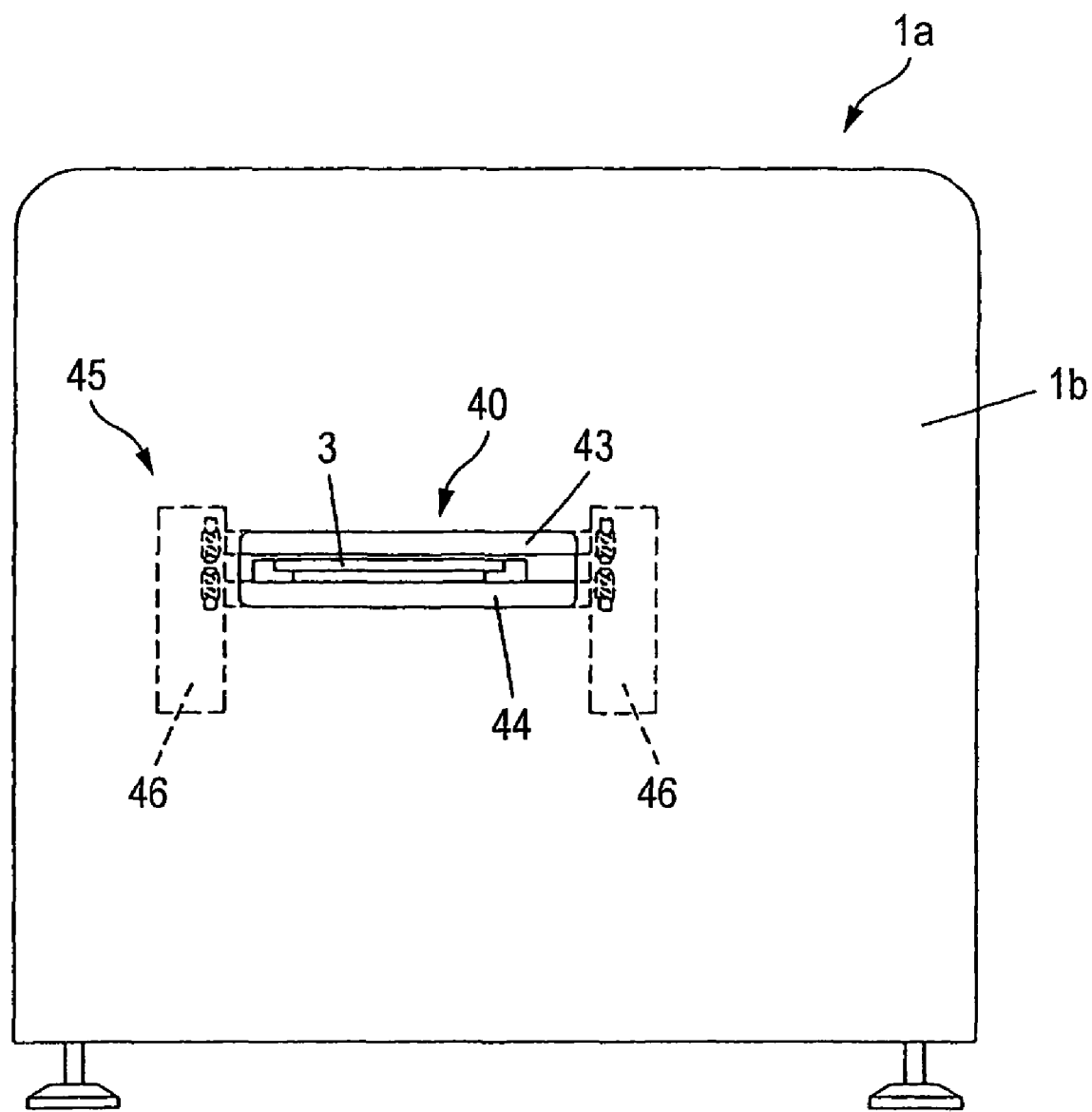
FIG. 9 is a side view of a case body of the screen printing apparatus according to one embodiment of the invention.
Figure 10A:
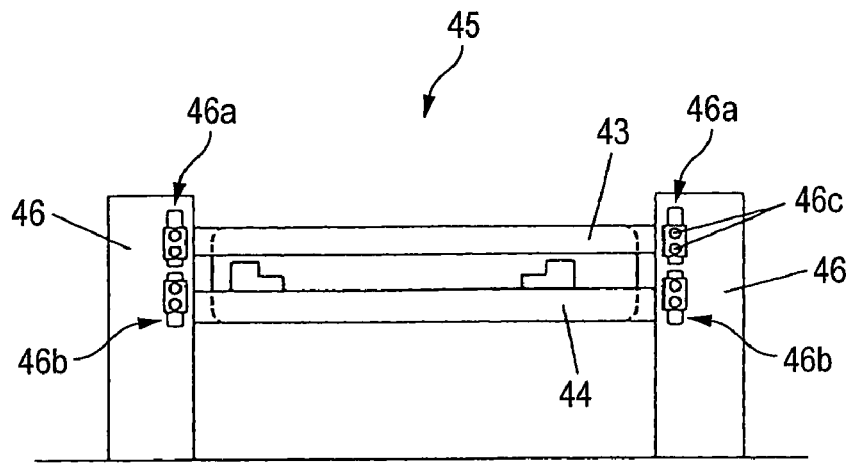
FIG. 10A is a front view of a shutter mechanism according to one embodiment of the invention.
Figure 10B:
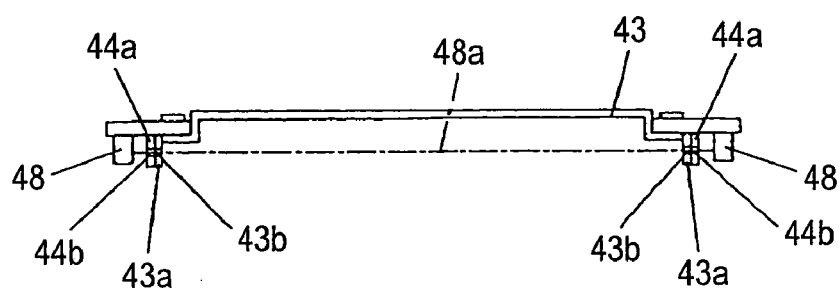
FIG. 10B is a plan view of the shutter mechanism according to one embodiment of the invention.
Figure 10C:
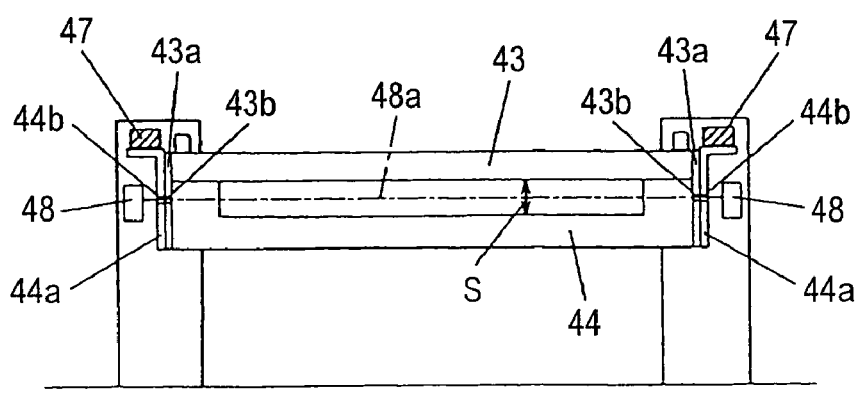
FIG. 10C is a back view of the shutter mechanism according to one embodiment of the invention.
Figure 11A:
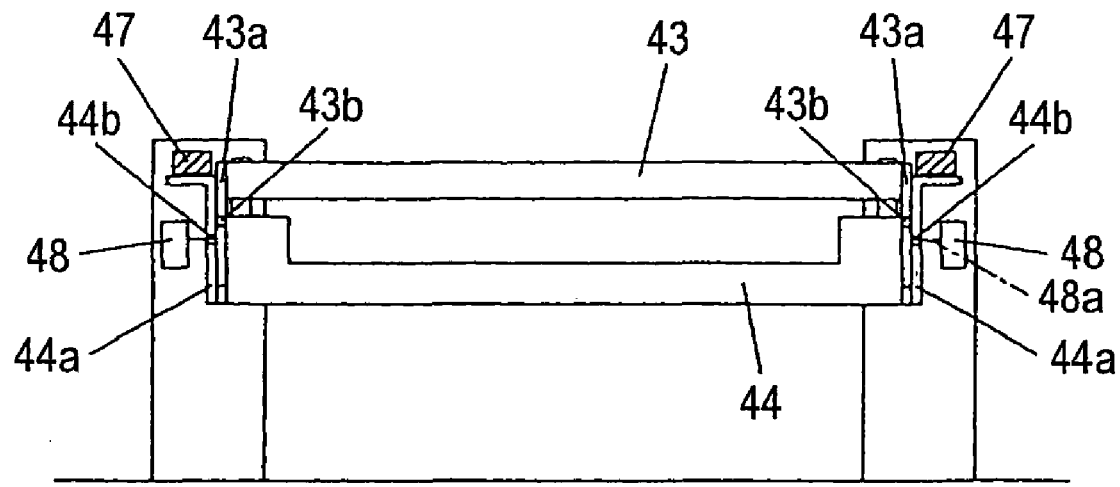
FIG. 11A is an explanatory view the operation of the shutter mechanism according to one embodiment of the invention.
Figure 11B:
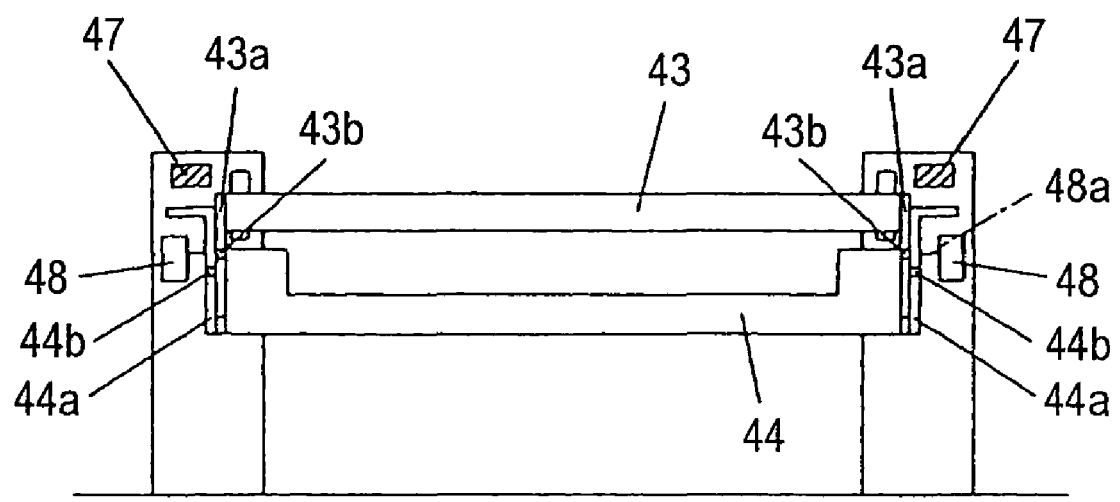
FIG. 11B is an explanatory view of the operation of the shutter mechanism according to one embodiment of the invention.
Figure 12:
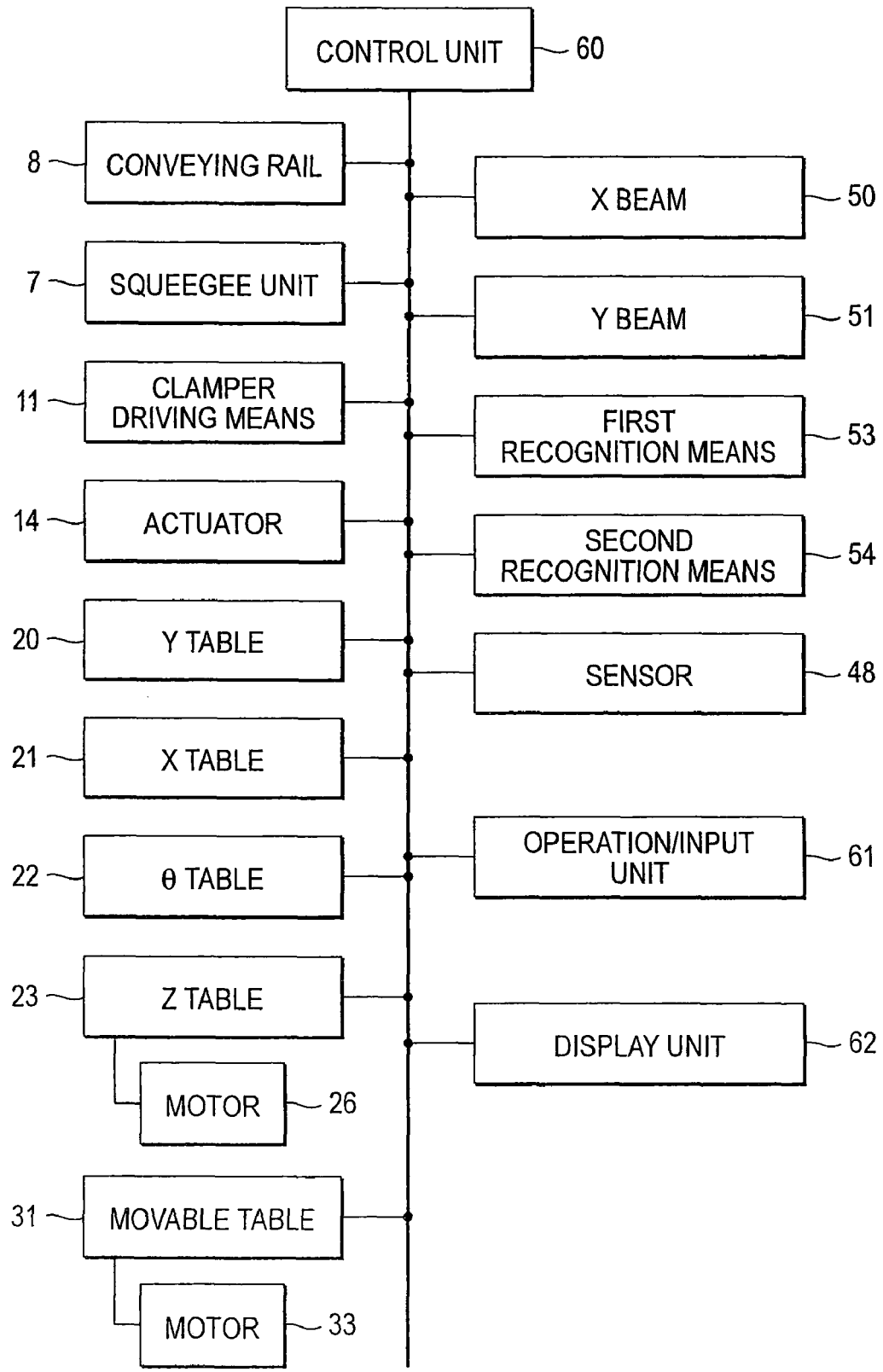
FIG. 12 is a block diagram of a control system of the screen printing apparatus according to one embodiment of the invention.
Figure 13A:
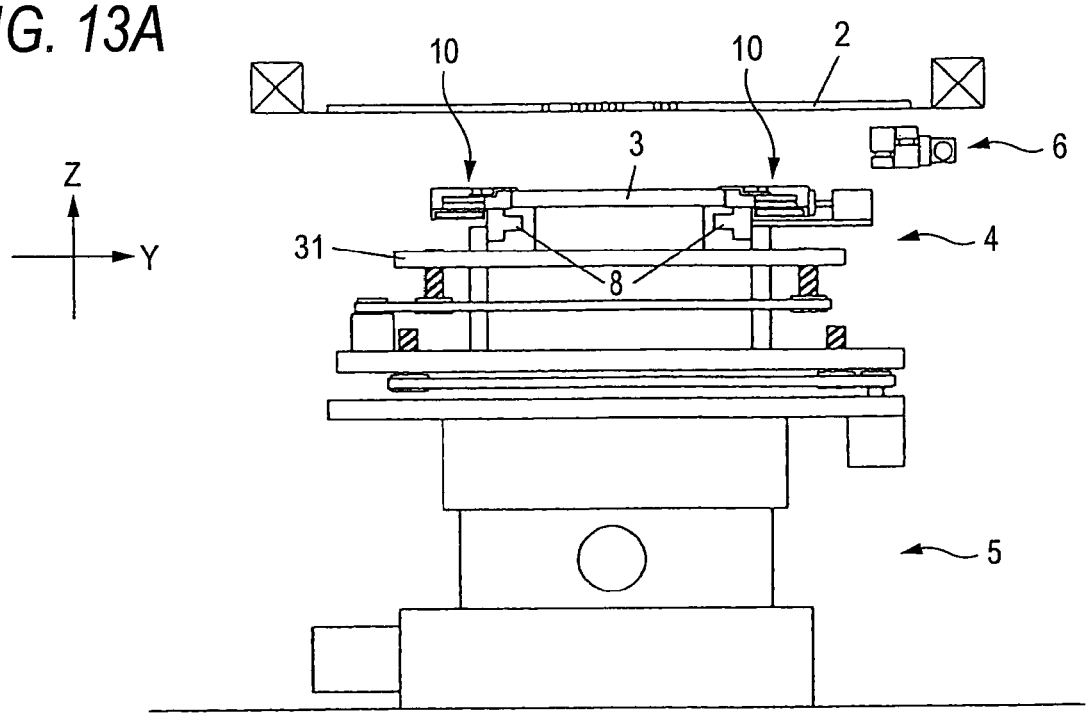
FIG. 13A is an explanatory view of the operation of the screen printing apparatus according to one embodiment of the invention.
Figure 13B:
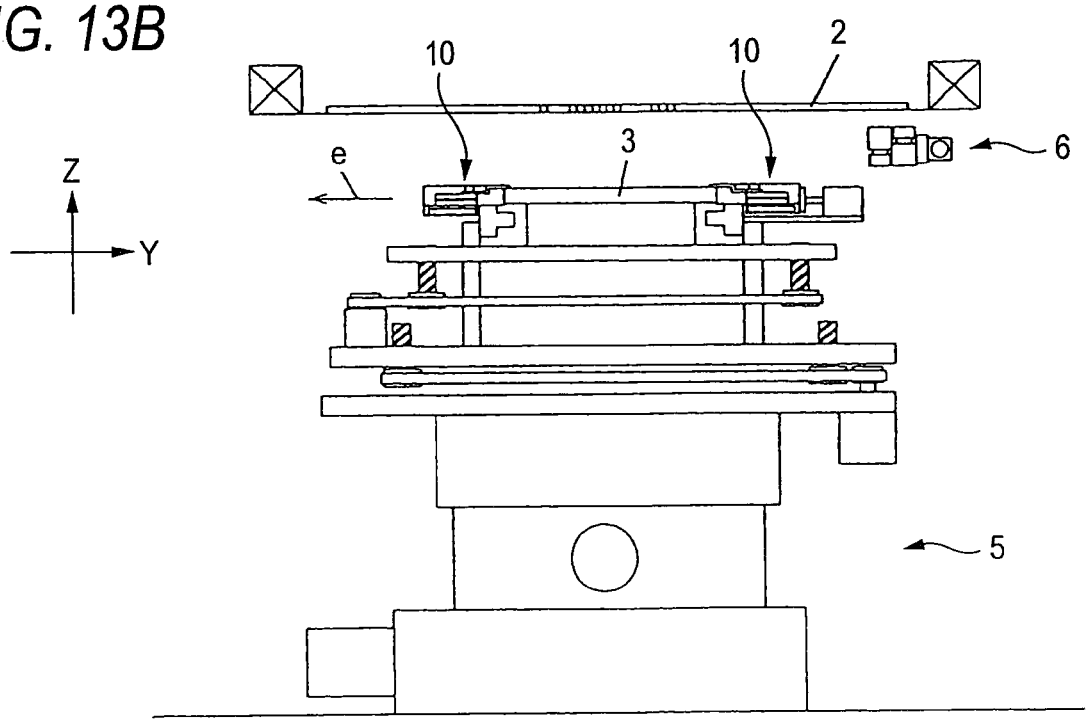
FIG. 13B is an explanatory view of the operation of the screen printing apparatus according to one embodiment of the invention.
Figure 14A:
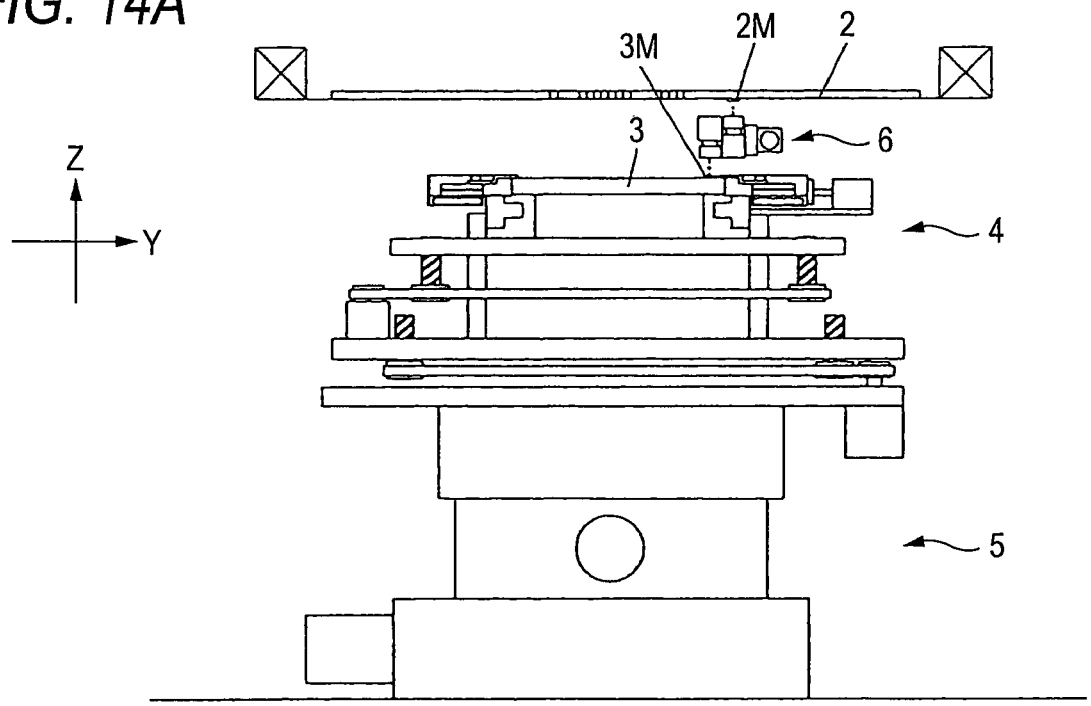
FIG. 14A is an explanatory view of the operation of the screen printing apparatus according to one embodiment of the invention.
Figure 14B:
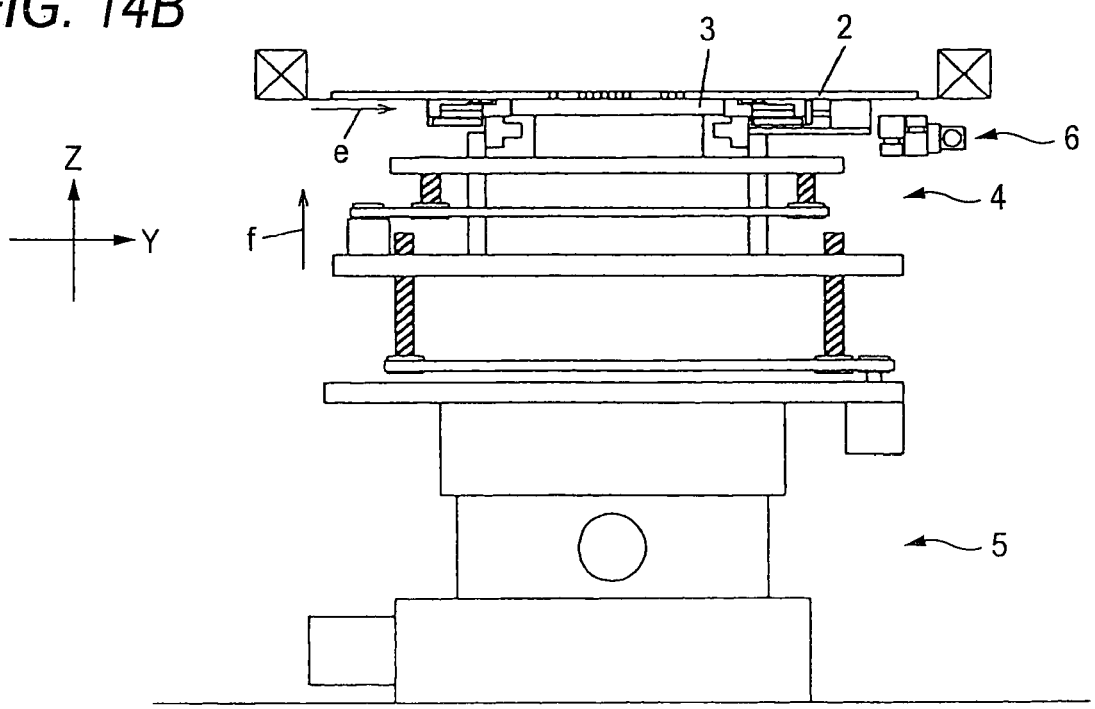
FIG. 14B is an explanatory view of the operation of the screen printing apparatus according to one embodiment of the invention.
Figure 15A:
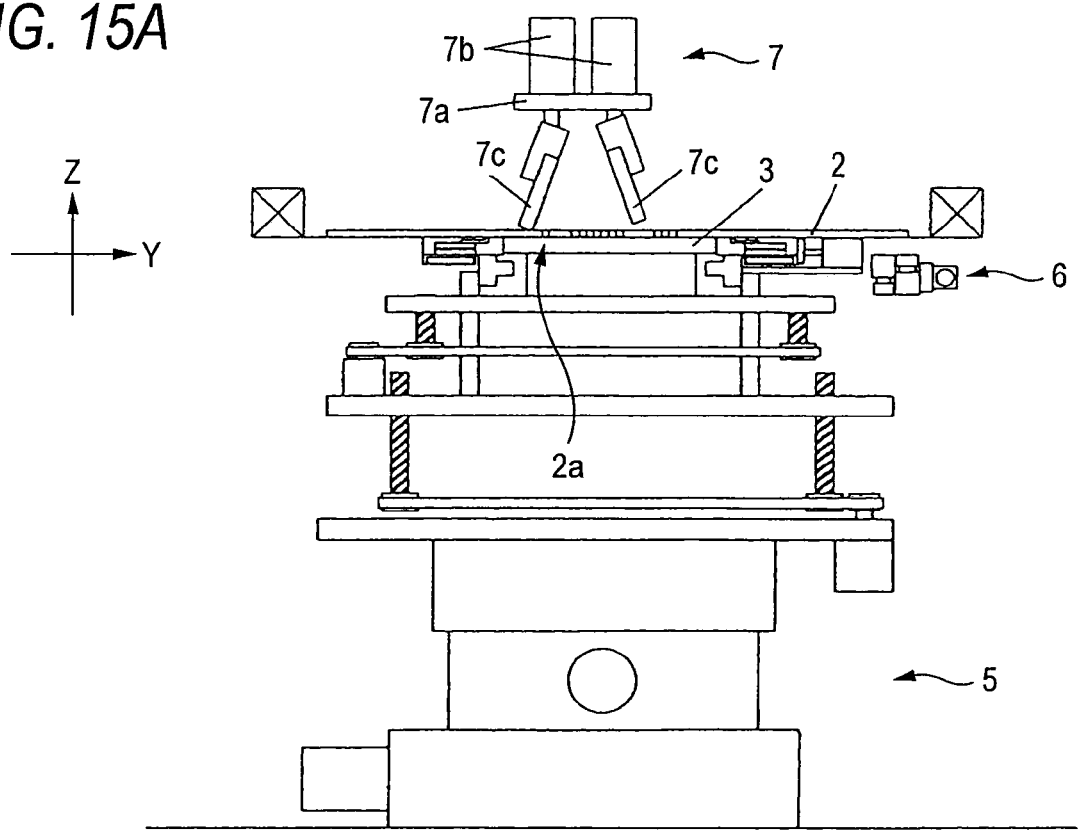
FIG. 15A is an explanatory view of the operation of the screen printing apparatus according to one embodiment of the invention.
Figure 15B:
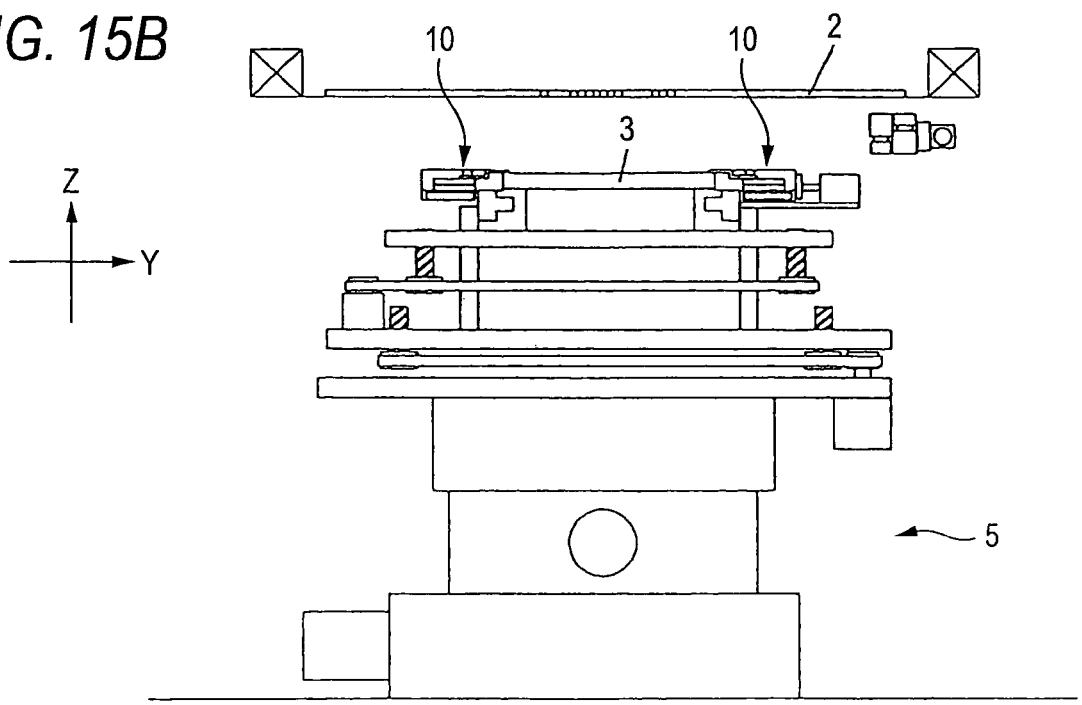
FIG. 15B is an explanatory view of the operation of the screen printing apparatus according to one embodiment of the invention.
Figure 16:
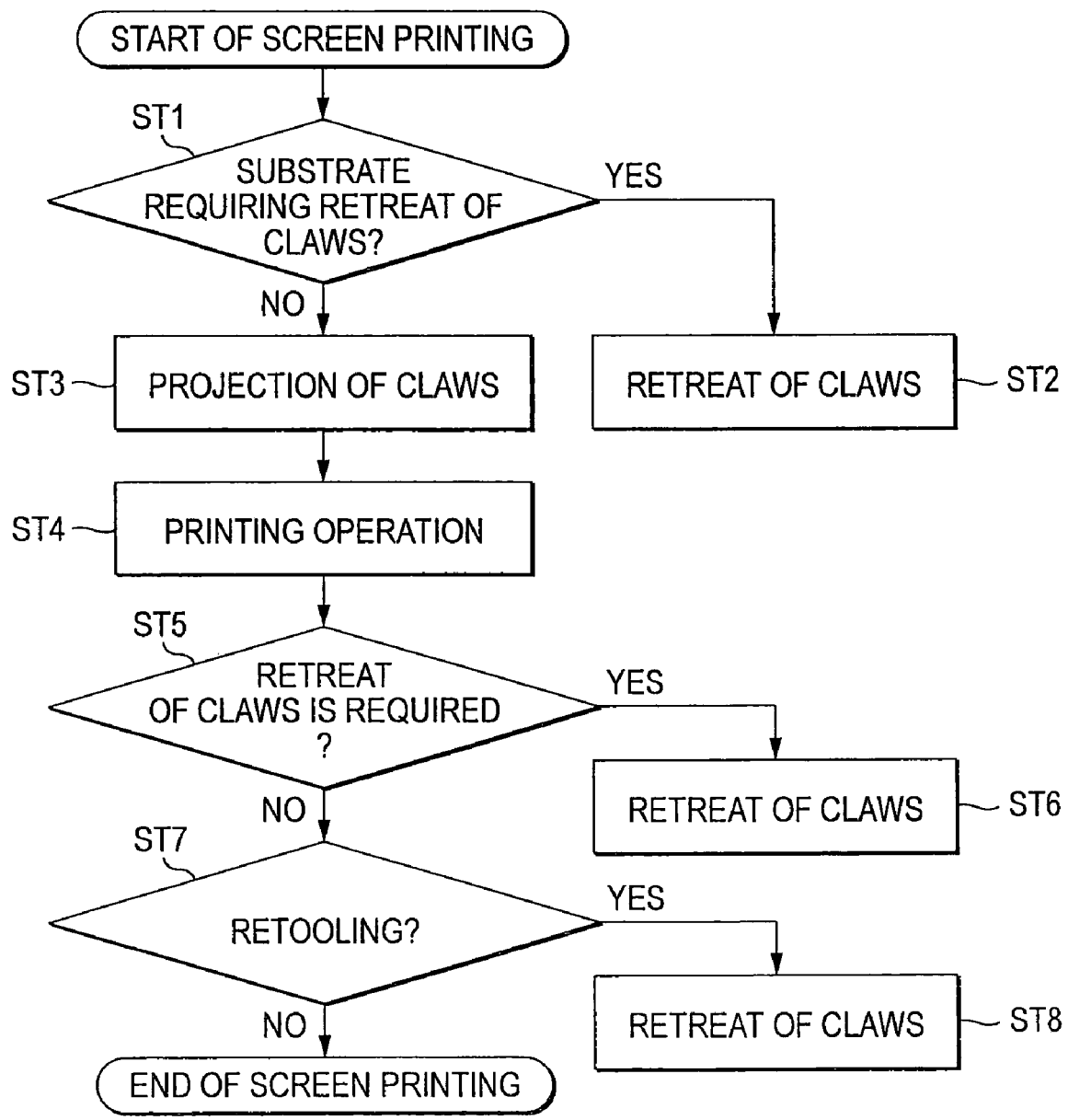
FIG. 16 is a flow chart showing the operation of a movable claws according to one embodiment of the invention.

One embodiment of the invention will be described with reference to the accompanying drawings. FIG. 1 is a side view of a screen printing apparatus according to one embodiment of the invention, FIG. 2 is a front view of the screen printing apparatus according to one embodiment of the invention, FIG. 3A is a plan view of a substrate supporter according to one embodiment of the invention, FIG. 3B is a plan view of the substrate supporter according to one embodiment of the invention, FIG. 4A is a partial side sectional view of the substrate supporter according to one embodiment of the invention, FIG. 4B is a partial side sectional view of the substrate supporter according to one embodiment of the invention, FIG. 4C is a partial side sectional view of the substrate supporter according to one embodiment of the invention, FIG. 5 is a plan view and partially enlarged plan view of the substrate supporter according to one embodiment of the invention, FIG. 6A is an explanatory view of the operation of the substrate supporter according to one embodiment of the invention, FIG. 6B is an explanatory view of the operation of the substrate supporter according to one embodiment of the invention, FIG. 7A is a plan view showing the positional relationship among a mask, a substrate, and a recognition device according to one embodiment of the invention, FIG. 7B is a plan view showing the positional relationship among the mask, the substrate, and the recognition device according to one embodiment of the invention, FIG. 8A is a plan view of the recognition device according to one embodiment of the invention, FIG. 8B is a side view showing the positional relationship among the mask, the substrate, and the recognition device according to one embodiment of the invention, FIG. 9 is a side view of a case body of the screen printing apparatus according to one embodiment of the invention, FIG. 10A is a front view of a shutter mechanism according to one embodiment of the invention, FIG. 10B is a plan view of the shutter mechanism according to one embodiment of the invention, FIG. 10C is a back view of the shutter mechanism according to one embodiment of the invention, FIG. 11A is an explanatory view the operation of the shutter mechanism according to one embodiment of the invention, FIG. 11B is an explanatory view of the operation of the shutter mechanism according to one embodiment of the invention, FIG. 12 is a block diagram of a control system of the screen printing apparatus according to one embodiment of the invention, FIG. 13A is an explanatory view of the operation of the screen printing apparatus according to one embodiment of the invention, FIG. 13B is an explanatory view of the operation of the screen printing apparatus according to one embodiment of the invention, FIG. 14A is an explanatory view of the operation of the screen printing apparatus according to one embodiment of the invention, FIG. 14B is an explanatory view of the operation of the screen printing apparatus according to one embodiment of the invention, FIG. 15A is an explanatory view of the operation of the screen printing apparatus according to one embodiment of the invention, FIG. 15B is an explanatory view of the operation of the screen printing apparatus according to one embodiment of the invention, and FIG. 16 is a flow chart showing the operation of a movable claws according to one embodiment of the invention.

First, the entire configuration of the screen printing apparatus will be described with reference to FIGS. 1 and 2. In FIGS. 1 and 2, the screen printing apparatus 1 is an apparatus which prints a patter with paste on the surface of a substrate 3 which is aligned with a mask 2 in which predetermined pattern openings 2a are formed. The screen printing apparatus 1 includes a substrate holding device 4 which holds the substrate 3, a substrate moving device 5 which moves the substrate holding device 4 relative to a mask 2, and performs alignment of the substrate 3 and the mask 2, a recognition device 6 which moves horizontally between the mask 2 and the substrate 3 to recognize the mask 2 from below and recognize the substrate 3 from above, a squeegee unit 7 which applies and spread the paste supplied to the surface of the mask 2 to cause a pattern to be printed on the surface of the substrate 3 with the paste stagnated inside the pattern openings 2a.

The substrate holding device 4 is constituted by conveying rails 8 which convey the substrate 3 in an X direction, and dampers 10 which clamp and hold the substrate 3 conveyed by the conveying rails 8 with their facing sides. The dampers 10 are provided in the pair of conveying rails 8, respectively, to make a pair, and are adapted to be brought close to and separated from each other by driving of the damper moving device 11. In a state where the dampers 10 are separated from each other, they are adapted so as not to disturb movement of the substrate 3 during conveyance of a substrate, and in a state where the dampers 10 are brought close to each other, they are adapted to clamp facing sides of the substrate 3 to hold the substrate 3 in a predetermined position.

The substrate moving device 5 is constructed by stacking a Y table 20, an X table 21, and a θ table 22 which move the substrate 3 held by the substrate holding device 4 in a horizontal direction (X, Y, and θ direction), and a Z table 23 which moves the substrate in a vertical direction (Z direction), and the Z table 23 is disposed above a plate 24 attached to an upper portion of the θ table 22. The Z table 23 has a rectangular shape in plan view, and the Z table is horizontally supported in a state where it is screwed to four corners with four ball screws 25 whose feeding direction is the vertical direction (FIG. 1 shows two side ball screws, and FIG. 2 shows two front ball screws). The plate 24 is provided with a motor 26 as a driving device which rotates the ball screws 25. The ball screws 25 and the motor 26 are provided with pulleys 27 and 28, respectively, and rotational driving of the motor 26 is transmitted to the four ball screws 25 by a timing belt 29 which is suspended over the pulleys 27 and 28. This causes the four screw balls 25 to rotate in synchronization with one another and causes the Z table to ascend and descend while being kept horizontal. By controlling driving of the Y table 20, X table 21, θ table 22, and Z table 23 configured as such to move the substrate holding device 4 relative to the mask 2, the alignment between the substrate 3 and the mask 2 is made.

The substrate elevating device 30 which causes the substrate 3 to ascend and descend to perform relative leveling of the surface of the substrate 3 and the top faces of the dampers 10 relatively is disposed below the substrate holding device 4. The substrate elevating device 30 is mainly composed of a movable table 31 having a rectangular shape in plan view, and is horizontally supported in a state where it is screwed to four corners with four ball screws 32 whose feeding direction is the vertical direction (FIG. 1 shows two side ball screws, and FIG. 2 shows two front ball screws). The Z table 23 is provided with a motor 33 as a driving device which rotates the ball screws 32. The ball screws 32 and the motor 33 are provided with pulleys 34 and 35, respectively, and rotation of the motor 33 is transmitted to the four ball screws 32 by a timing belt 36 which is suspended over the pulleys 34 and 35. This causes the four ball screws 32 to rotate in synchronization with one another, and causes the movable plate 31 to ascend and descend while being kept horizontal. A spacer 37 is provided in an upper portion of the movable plate 31 in a vertical lower position of the substrate 3. By causing the movable plate 31 to ascend and descend in a state where the spacer 37 is caused to abut on the rear face of the substrate 3, the substrate 3 can ascend and descend with respect to the dampers 10 to perform relative leveling of the surface of the substrate 3 and the top faces of the dampers 10.

In FIG. 2, the screen printing apparatus 1 is covered with and shielded by the box body 1a, and openings 40 through which the substrate 3 to be carried into and out of the screen printing apparatus 1 passes are formed in side walls 1b, respectively, of the box body 1a. Through these openings 40, transfer of the substrate 3 is performed between a carrying-in path 41 or a carrying-out path 42, which is disposed outside the side wall 1b, and the conveying rails 8. The conveying rails 8 extend to the vicinities of the side walls 1b, and the ends of the conveying rails 8 are provided with adjusting parts 9 which adjust clearance with the side walls 1b.

Next, with reference to FIGS. 3 to 6, the substrate holding device 4 will be described in detail. In FIG. 3A, the dampers 10 are provided in the pair of conveying rails 8, respectively, to make a pair, and are adapted to clamp the facing sides of the substrate 3 to hold the substrate 3. Depressed parts 12 are formed in the top faces of the dampers 10, respectively, and movable claws 13 are provided in the depressed parts 12. In FIG. 4A, each movable claw 13 is composed of a flexible plate-like member having a thickness of about 0.1 mm, and is formed in a shape having flat plate parts 13a and 13b which are bent into a hook and have different stages. The lower-stage flat plate part 13a is attached to a movable part 14a of an actuator 14 provided inside each damper 10. A top face of the upper-stage flat plate part 13b becomes flush with a top face the damper 10 so as not to project above the damper 10. The actuator 14 is composed of a driving part 14b using magnetic force or pressure and the above-mentioned movable part 14a. By controlling driving of the driving part 14b in a Y direction, the movable part 14a moves horizontally. With the horizontal movement of the movable part 14a, the movable claw 13 moves horizontally, and the upper-stage flat plate part 13b of the movable claw 13 moves selectively to a position (arrow 'a' of FIG. 4A) where it has projected above the substrate 3, and to a position (arrow 'b' of FIG. 4B) where it has retreated from above the substrate 3.

When the movable claw 13 is in the position (arrow 'a' of FIG. 4A) where it projects above the substrate 3, upward movement of the substrate 3 is constrained. Since the substrate 3 after printing is caused to descend and separated from the mask 2 in a state where the substrate is held by the damper 10, the movable claw 13 can prevent that the paste which has adhered to a rear face of the mask 2 adheres on the surface of the substrate 3 and the substrate 3 floats and drops out from the damper 10.

In addition, leveling of the surface of the substrate 3 and the top face of the damper 10 is performed by causing the movable plate 31 to ascend and descend in a state where the spacer 37 is caused to abut on the rear face of the substrate 3 to adjust the height position of the substrate 3. Therefore, when the upper-stage flat plate part 13b of the movable claw 13 is in the position (arrow 'a' of FIG. 4A) where it has projected above the substrate 3, the height of the substrate 3 is adjusted to such a degree that the surface of the substrate 3 contacts the rear face of the upper-stage flat plate part 13b of the movable claw 13. Although this amount of height adjustment is changed according to the thickness of a substrate 3, even in a case where the substrate 3, as shown in FIG. 4C, ascends excessively due to erroneous input of thickness data of a substrate, or the like, the movable claw 13 having flexibility is bent upward so as to prevent damage to the movable claw 13 itself or the substrate 3. Moreover, in a case where the substrate 3 is a substrate which does not require a high degree of printing precision, even if the height of the substrate 3 is adjusted so that the surface of the substrate 3 may become almost flush with the top face of the damper 10, printing quality does not deteriorate due to a gap created around the movable claw 13 between the mask 2 and the substrate 3 since the thickness of the movable claw 13 is small.

On the other hand, when the movable claw 13 is in the position (arrow 'b' of FIG. 4B) which it has retreated from above the substrate 5, upward movement of the substrate 3 is not constrained, but the substrate 3 can be caused to ascend until the surface of the substrate 3 and the top face of the damper 10 become flush with each other. Thereby, when the substrate 3 is brought into surface contact with the mask during printing, any clearance which is equivalent to the thickness of the movable claw 13 between the mask 2 and the substrate 3 is not created. Thus, the rear face of the mask 2 and the surface of the substrate 3 can be brought into surface contact with each other without any clearance. If printing is performed in this state, the paste stagnated in the pattern openings 2a will not overflow into other parts. When the substrate 3 is a fine pitch substrate, print precision can be improved by locating the movable claw 13 in the position (arrow 'b' of FIG. 4B) where it has retreated from above the substrate 3 to perform printing. Moreover, even during the maintenance of the screen printing apparatus 1, by locating the movable claw 13 in the position (arrow 'b' of FIG. 4B) where it has retreated from above the substrate 3, an accident that an operator contacts the movable claw 13 projected from the damper 10, and damages the movable claw can be prevented beforehand to enhance the safety during maintenance.

In a case where printing is performed in a state where the movable claw 13 is in the position (arrow 'b' of FIG. 4B) where it has retreated from above the substrate 3, the constraint of the upward movement of the substrate 3 vanishes. Thus, the substrate 3 is attracted toward the spacer 37, thereby preventing dropout of the substrate caused by its floating from the damper 10.

In addition, a plurality of the movable claws 13, as shown in FIG. 3B, may be provided in the damper 10. By selecting movable claws 13 (three movable claws excluding the movable claws at both ends in FIG. 3B) corresponding to the width in the X direction of the substrate 3 among the plurality of movable claws 13 to cause them to project above the substrate 3, dropout of the substrate 3 can be prevented positively.

As such, since the movable claws 13 are provided in the damper 10 holding the substrate 3 so that the movable claws 13 can be selectively moved to the position where they have projected above the substrate 3, and to the position where they have retreated from above the substrate 3, the safety of operation is ensured by causing the movable claws 13 to retreat during maintenance. Moreover, since the surface of the substrate 3 and the surface of the mask 2 can be brought into surface contact with each other without any clearance by causing the movable claws 13 to retreat, thereby leveling the surface of the substrate 3 and the top face of the damper 10, advanced printing quality can be expected.

In FIG. 5, grooved conveying paths 8a are formed in the top faces of the pair of conveying rails 8, respectively, and side parts of the substrate 3 are held by the conveying paths 8a to thereby stabilize the conveyance posture of the substrate. A clearance c1 is formed between the adjusting parts 9 and the side wall 1b provided at both ends of the conveying rails 8 (see the enlarged view). This clearance c1 becomes movement margins in the X direction and the θ direction of the substrate holding device 4 which is moved relative to the mask 2 by driving of the substrate moving device 5 at the time of the alignment of the substrate 3 and the mask 2. By this clearance c1, the movement spaces for the conveying rails 8 in the X direction and the θ direction can be ensured, and the substrate 3 held by the damper 10 can be moved in the X direction and the θ direction.

Each adjusting part 9 is attached to one end of a rod-shaped body 8c inserted through a supporting part 8b attached to an end of each conveying rail 8. The rod-shaped body 8c is inserted through the supporting part 8b, and is movable in the conveying direction of the substrate 3, so that the adjusting part 9 can be brought close to and separated from the end of the conveying rail 8. A spring 8d that is a biasing device is formed at a periphery of the rod-shaped body 8c between the supporting part 8b and the adjusting part 9, and the adjusting part 9 is biased in a direction (arrow 'a') away from the end of the conveying rail 8. A stopper 8e is provided at the other end of the rod-shaped body 8c to regulate a maximum separation distance of the adjusting part 9 biased by the spring 8d and the end of the conveying rail 8 to a clearance c2. The top face of the adjusting part 9 is formed with a conveying path 9e having the same cross-sectional shape as the conveying path 8a formed on the top face of the conveying rail 8, and the conveying path 9e is integrated with the conveying path 8a to form a conveying path for the substrate 3.

By causing the adjusting part 9 configured in this way to approach and separate from the end of the conveying rail 8, the extension of the conveying path for the substrate 3 in the X direction can be adjusted. Moreover, the clearance between the conveying path and the side wall 1b can be adjusted. When the adjusting part 9 is moved toward the conveying rail 8 (arrow 'b') against the biasing force of the spring 8d, the clearance c1 will increase as much as the clearance c2 decreases, and will increase up to a maximum clearance C3 (c3=c1+c2). Therefore, if the movement margins of the substrate holding device 4 in the X direction and the θ direction for the alignment of the substrate 3 and the mask 2 are required to exceed the clearance c1, the clearance can be increased up to the maximum clearance c3 by moving the adjusting part 9 toward the conveying rail 8. Thereby, the movement space of the conveying rail 8 in the X direction and the θ direction can be increased to greatly move the substrate 3 held by the damper 10 in the X direction and the θ direction.

In addition, the movement of the adjusting part 9 (arrow 'b') toward the conveying rail 8 is performed by abutment of the adjusting part 9 on the side wall 1b when the conveying rail 8 moves in the X direction and the θ direction beyond the clearance c1 during alignment. For example, as shown in FIG. 6A, if a movement margin in the X direction required for alignment is larger than a space ensured by the clearance c1, the adjusting parts 9a and 9b abut on the side wall 1b, and move toward the conveying rail 8, so that the space equivalent to the maximum clearance c3 can be ensured as the movement margin in the X direction. Moreover, as shown in FIG. 6B, when a movement margin in the θ direction required for alignment is larger than a space ensured by the clearance c1, the adjusting parts 9b and 9c abut on the side wall 1b and move toward the conveying rail 8, so that the space equivalent to the maximum clearance c3 is ensured as the movement margin in the θ direction.

As such, since the adjusting part 9 which is brought close to and separated from the end of the conveying rail 8 is provided so that the length of the conveying path in the substrate conveying direction can be adjusted, the stability of the conveyance posture of the substrate 3 during substrate transfer and ensuring of the movement margins of the substrate holding device 4 during substrate alignment can be realized compatibly. That is, during the substrate transfer, the conveying path 8a of the conveying rail 8 and the conveying path 9e of the adjusting part 9 are integrated with each other in a state where they are separated from each other, and consequently the conveying path of the substrate 3 is lengthened, so that the clearance of the conveying path and the carrying-out path 41 (carrying-in path 42) can become small, and the conveyance posture of the substrate 3 can be stabilized. Moreover, during the alignment between the substrate 3 and the mask 2, the conveying path 8a of the conveying rail 8 and the conveying path 9e of the adjusting part 9 approach each other, and consequently the conveying path of the substrate 3 is shortened, so that the clearance c3 as the movement margin of the substrate holding device 4 can be ensured greatly.

In addition, in FIG. 2, even in a case where the height position of the conveying rail 8 which are caused to ascend and descend by driving of the Z table 23 is located in any position, the adjusting part 9 is formed long in the vertical direction (Z direction) that the adjusting part 9 may not project from the opening 40. The supporting part 8b is also formed to have the length corresponding to the length of the adjusting part 9, and a plurality of rod-shaped bodies 8c, springs 8d, and stoppers 8e are formed at suitable intervals.

Next, with reference to FIGS. 2, 7, and 8, the recognition device 6 will be described in detail. In FIGS. 2 and 7B, the recognition device 6 is provided in an X beam 50 extending in the X direction, and is adapted to be movable in the X direction. The X beam 50 extends beyond the length of the mask 2 in the X direction, and the recognition device 6 is adapted to be able to advance and retreat between the mask 2 and the substrate 3. The recognition device 6 advances between the mask 2 and the substrate 3 during recognition, to recognize the positions of the mask 2 and the substrate 3, and the recognition device retreats from between the mask 2 and substrate 3 during printing so as not disturb the ascent of the substrate 3 aligned with the mask 2. The X beam 50 is provided in a Y beam 51 extending in the Y direction, and is adapted to be movable in the Y direction. By controlling driving of the X beam 50 and the Y beam 51, the recognition device 6 can be caused to advance and retreat between the substrate 3 and the mask 2, and can be moved to an arbitrary position between the mask 2 and the substrate 3.

In FIGS. 7A and 7B, a first recognized part 3m and a second recognized part 2m to be used as the references of alignment are provided on the surface of the substrate 3 and the rear face of the mask 2, respectively. By overlapping the first recognized part 3m with the second recognized part 2m, the mask 2 and the substrate 3 are aligned with each other.

In FIGS. 8A and 8B, the recognition device 6 is attached to the X beam 50 by means of a bracket 52. The recognition device 6 is composed of a first recognition device 53 and a second recognition device 54, including an image pick-up device, such as CCD cameras. The first recognition device 53 and the second recognition device 54 are arranged in parallel in a state where they are offset in the Y direction (offset amount c) perpendicular to the X direction which is the transfer direction of the substrate. In FIG. 8B, the first recognition device 53 is disposed with its light-receiving part 53a turned to the vertical lower side, and is adapted to recognize the first recognized part 3m provided on the substrate 3. On the other hand, the second recognition device 54 is disposed with its light-receiving part 54a turned to the vertical upper side, and is adapted to recognize the second recognized part 2m provided on the mask 2. During recognition of the substrate 3 and the mask 2, the substrate 3 is offset (offset amount c) in the Y direction with respect to the mask 2, and the first and second recognized parts 3m and 2m are offset (offset amount c) in the Y direction. Thereby, the first recognition device 53 can be located in a position above the first recognized part 3m, and the second recognition device 54 can be located below the second recognized part 2m, so that the simultaneous recognition becomes possible, which is efficient.

The recognition device 6 configured in this way advances and retreats between the substrate 3 and the mask 2 by controlling driving of the X beam 50 and Y beam 51 that are moving device, and moves horizontally in a range including the first recognized part 3m and the second recognized part 2m to pick up the images of the first recognized part 3m and the second recognized part 2m using the first recognition device 53 and the second recognition device 54. The picked-up image data is analyzed by a control unit 60 (refer to FIG. 12), and thereby the positional deviation amount between the substrate 3 and the mask 2 is detected. By controlling driving of the Y table 20, X table 21, and θ table 22 on the basis of the detected positional deviation amount, positional correction of the substrate 3 is performed, and the alignment between the substrate 3 and the mask 2 in the X, Y, and θ directions (horizontal direction) is performed. In addition, in this alignment, the driving of the Y table 20 may be controlled in consideration of the offset amount c between the first recognition device 43 and the second recognition device 44, or the substrate 3 may be moved by the offset amount c after the positional correction of the substrate 3 is performed in the offset state.

When the alignment between the substrate 3 and the mask 2 in the horizontal direction has been completed, the alignment between the substrate and the mask in the Z direction (vertical direction) is then performed. The alignment in the vertical direction is performed by raising the Z table 23 to bring the top face of the substrate 3 into surface contact with the rear face of the mask 2.

Meanwhile, since the Z table 23 is configured such that it is fed in the vertical direction by the ball screws 25 so as to ascend and descend, any positional deviation in the X, Y, and θ directions may occur in the process of the ascent and descent due to an error resulting from the machining accuracy of the ball screws 25, an installation error caused during installation of the ball screws 25, and the like. The accuracy of position of the Z table 23 in the X, Y, and θ directions deteriorates in proportion to the feeding amount by the ball screws 25. As a result, in a case where the substrate 3 which has been aligned in the X, Y, and θ directions is raised and brought into surface contact with the rear face of the mask in a state where the clearance from the mask 2 is ensured in order to move the recognition device 6, any positional deviation occurs in the X, Y, and θ directions of the substrate 3 due to the ascent of the Z table 23, and consequently the accuracy of alignment between the substrate 3 and the mask 2 deteriorates.

Therefore, in this embodiment, since the height of the recognition device 6 is controlled by offsetting the first recognition device 43 and the second recognition device 44 and arranging them in parallel in the horizontal direction (Y direction) as shown in FIG. 8B, the clearance d required during recognition can be controlled small. Thereby, since the ascending stroke of the Z table 23 during the alignment in the Z direction can be shortened, the position misalignment in the horizontal direction of the substrate 3 caused by the raising is suppressed, deterioration of the accuracy of alignment between the substrate 3 and the mask 2 can be suppressed, and the reliability of printing quality can be improved.

Next, with reference to FIGS. 9 to 11, a shutter mechanism provided in the opening 40 will be described. In FIG. 9, an opening 40 serving as a passage for the substrate 3 during substrate transfer is formed in a side wall 1b of the box body 1a. In the vicinity of the opening 40, the shutter mechanism 45 is formed within the box body 1a.

In FIG. 10A, the shutter mechanism 45 includes an upper shutter 43 and a lower shutter 44 which narrow an upper portion and a lower portion of the opening 40 to such a degree that the substrate 3 can pass, and shutter holding parts 46 which hold the upper shutter 43 and the lower shutter 44, respectively, so as to be movable up and down. The shutter holding parts 46 are erected on both sides of the opening 40.

Elongate holes 46a and 46b extending in up-and-down directions are formed vertically in each shutter holding part 46. The upper shutter 43 is attached to the upper elongate holes 46a with screws 46c, and is adapted to be movable in the up-and-down directions along the elongate holes 46. The lower shutter 44 is attached to the lower elongate holes 46b with the screws 46c, and is adapted to be movable in the up-and-down directions along the elongate holes 46b. The upper shutter 43 narrows the upper portion of the opening 40 to such a degree that the substrate 3 can pass in a state where it is locked to the lower portion of the elongate hole 46a, and the lower shutter 44 narrows the lower portion of the opening 40 to such a degree that the substrate 3 can pass in a state where it is locked to the upper portion of the elongate hole 46b.

In FIG. 10B, each of both ends of the upper shutter 43 and the lower shutter 44 is formed in the shape of a hook in plan view, and, as shown in FIG. 10C, it has portions where a hook part 43a extending downward from the upper shutter 43 and a hook part 44a extending upward from the lower shutter 44 overlap each other. Sensor holes 43b and 44b are formed in the portions where the hook part 43a and the hook part 44a overlap each other. These sensor holes 43b and 44b overlap each other in a state where the upper shutter 43 and the lower shutter 44 are locked to the lower portion of the elongate hole 46a, and the upper portion of the elongate hole 46b, respectively. An upper portion of the hook part 44a is provided with a metal part which is magnetized by a magnet 47 provided in the shutter holding part 46. As the metal part is magnetized by the magnet 47, the lower shutter 44 is temporarily locked to the upper portion of the elongate hole 46b. When an operator's hand or finger, a foreign object, or the like contacts the lower shutter 44, the lower shutter is released from the temporary locked state by the magnetization, and is dropped and moved downward.

In FIGS. 10B and 10C, a transmissive sensor 48 is provided in each shutter holding part 46, and is adapted to project and receive sensor light 48a in a state where the upper shutter 43 and the lower shutter 44 are locked to the lower portion of the elongate hole 46a and the upper portion of the elongate hole 46b, respectively, and thereby the sensor holes 43b and 44b overlap each other. The sensor 48 detects that the relative position of the sensor holes 43b and 44b deviates, and thus the sensor light 48a has been shielded, thereby detecting that at least any one shutter of the upper shutter 43 and the lower shutter 44 has moved in the up-and-down directions. For example, when the upper shutter 43 moves up as shown in FIG. 11A, the sensor hole 43b will also move up and the relative position with respect to the sensor hole 44b will deviate. Thus, the sensor light 48a is shielded by the hook part 43a. Moreover, when the lower shutter 44 moves down as shown in FIG. 11B, the sensor hole 44b will also move down and the relative position with respect to the sensor hole 43b will deviate. Thus, the sensor light 48a is shielded by the hook part 44a. By detecting that the sensor light 48a has been shielded in this way, the sensor detects that at least any one shutter of the upper shutter 43 and the lower shutter 44 has moved in the up-and-down directions.

If the sensor 48 transmits a detection signal to the control unit 60 (refer to FIG. 12), and the control unit 60 receives the detection signal, various drive systems of the screen printing apparatus 1 will be stopped. As a result, when an operator's hand or finger, or a foreign object approaches the opening 40, and intersects the sensor light 48a to shield the sensor light, or an operator's hand or finger, or a foreign object does not intersect the sensor light 48a, but contacts the upper shutter 43 and the lower shutter 44 to move them in the up-and-down directions, various drive systems of the screen printing apparatus 1 are stopped, so that operator's safety is ensured. As shown in FIG. 10C, since the upper shutter 43 and the lower shutter 44 are brought close to each other to a distance 's' that the upper and lower portions of the opening 40 are narrowed to such a degree that the substrate 3 can pass, and the sensor light 48a scans almost a middle portion of a separation distance s between the upper shutter 43 and the lower shutter 44, an operator's hand or finger which enter the opening 40 is positively detected by the sensor light 48a, the upper shutter 43, or the lower shutter 44. Moreover, since the whole opening 40 is used as an area which can be detected by one sensor 48 using movement of the upper shutter 43 and the lower shutter 44, it is possible to obtain an economical simple structure without providing a plurality of sensors.

As such, since a set of upper and lower shutters 43 and 44 which narrows the opening 40 to such a degree that the substrate 3 can pass are provided, and drive systems of the screen printing apparatus 1 are stopped if an operator's hand or finger which has approached the opening 40 contacts the shutter 43 or 44 to move the shutter, special operation for safety measures is not needed, and operator's safety can be ensured without degrading manufacturing efficiency.

Next, the configuration of a control system of the screen printing apparatus 1 will be described with reference to FIG. 12. The control unit 60 is connected to the above-described squeegee unit 7, conveying rails 8, damper driving device 11, actuator 14, Y table 20, X table 2, θ table 22, motors 26 and 33, sensor 48, X beam 50, Y beam 51, first recognition device 53, and second recognition device 54, and controls each of the above operations on the basis of sequence data 60a. The control unit 60 includes a storage region and stores the sequence data 60a, substrate data 60b, various control parameters 60c, and the like. An operation/input unit 61 is composed of an operation/input device, such as a dry beam and a keyboard, for performing input of the sequence data 60a, substrate data 60b, and control parameters 60c, each manual operation of the above operations, etc. A display unit 62 is constituted by a display device, such as a CRT or a liquid crystal panel, which visually displays the control status by the control unit 50, guidance of input items, and the like.

The screen printing apparatus 1 according to this embodiment is configured as described above. Hereinafter, with reference to FIGS. 13 to 15, the screen printing operation in the screen printing apparatus 1 will be described.

In FIG. 13A, the substrate 3 which has been carried into a predetermined position by the conveying rails 8 is raised by the movable table 31, and held by the dampers 10.

In FIG. 13B, the substrate 3 is offset (arrow 'e') with respect to the mask 2 by driving of the substrate moving device 5.

In FIG. 14A, the recognition device 6 is moved to recognize the first recognized part 3m and the second recognized par 2m. Since the substrate 3 and the mask 2 are offset, the first recognized part 3m and the second recognized part 2m can be simultaneously recognized by the first recognition device 53 and the second recognition device 54. The recognition results are analyzed in the control unit 60, and thereby the amount of positional deviation between the substrate 3 and the mask 2 is detected.

In FIG. 14B, the control unit 60 controls driving of the substrate moving device 5 on the basis of the detected positional deviation amount to perform positional correction of the substrate 3, and to perform alignment between the substrate 3 and the mask 2. Thereby, the surface of the substrate 3 abuts on the rear face of the mask 2 (arrow 'f'). As described above, this alignment is performed in consideration of the offset of the substrate 3, and includes an operation of moving the substrate 3 in a direction (arrow 'g') opposite to an offset direction (arrow 'e'). The recognition device 6 retreats from between the substrate 3 and the mask 2 so as not to disturb the ascending movement of the substrate 3.

In FIG. 15A, by causing a squeegee 7c of the squeegee unit 7 to slide on the surface of the mask 2 in a state where the squeegee is caused to abut on the surface of the mask, the paste supplied to the surface of the mask 2 is applied and spread, and stagnated in the pattern openings 2a, thereby printing a pattern on the surface of the substrate 3. In addition, as shown in FIGS. 1 and 2, the squeegee unit 7 is adapted to be supported by the frame 7a, and be movable horizontally in the Y direction above the mask 2, and the squeegee 7c is lowered by the elevating device 7b, and is caused to abut on the surface of the mask 2.

In FIG. 15B, the substrate 3 on which a pattern is printed with paste is lowered, and separated from the mask 2.

In the above-described screen printing operation, the movable claws 13 provided in the dampers 10 are adapted to move selectively to the position (arrow 'a' of FIG. 4A) where they have projected above the substrate 3, and the position where they have retreated from above the substrate 3 (arrow 'b' of FIG. 4B). Hereinafter, movement of the movable claws 13 will be described with reference to a flow chart shown in FIG. 16.

When screen printing starts, first, it is determined whether or not the substrate 3 to be a target for screen printing is a substrate which needs to locate the movable claws 13 in the position where they have retreated from above the substrate (ST1). This determination may be made while an operator visually recognizes the substrate 3, and may be made while the recognition device 6 recognizes the type of a substrate 3 to collate it with the substrate data 60b. In a case where the substrate 3 is particularly a substrate which requires printing accuracy, such as a fine pitch substrate, it is determined that the substrate is a substrate which needs to locate the movable claws 13 in the position where they have retreated from above the substrate 3, and the movable claws 13 is caused to retreat from above the substrate 3 (ST2). Thereafter, the surface of the substrate 3 is substantially leveled with the top faces of the dampers 10. Thereby, the rear face of the mask 2 and the surface of the substrate 3 can be brought into surface contact with each other without any clearance, and overflow of the paste stagnated in the pattern openings 2a into other parts than a printed part of the surface of the substrate 3 can be avoided.

In a case where the substrate 3 as a printing target is an ordinary substrate which is not a fine pitch substrate, the movable claws 13 project above the substrate 3 (ST3). Since this constrains upward movement of the substrate 3, the substrate 3 can be prevented from dropping out of the dampers 10 in the printing operation (ST4) due to sticking to the paste adhering to the rear face of the mask 2.

In the process in which the printing operation (ST4) is performed, it is determined whether or not it is necessary to retreat the movable claws 13 from above the substrate 3 (ST5). For example, when an operator opens a safety guard provided in the screen printing apparatus 1 during maintenance, it is determined that it is necessary to retreat the movable claws 13 from above the substrate 3, and the movable claws 13 is caused to retreat from above the substrate 3 (ST6). If the movable claws 13 are caused to retreat from above the substrate 3, the removal of the substrate 3 becomes smooth, and the safety of the operator during maintenance can be enhanced.

After the screen printing on the substrate 3 is completed, it is determined whether or not retooling to the next substrate 3 is required (ST7). If retooling is required, the movable claws 13 are caused to retreat from above the substrate 3 (ST8) in preparation for carrying in of the next substrate 3.

In addition, the configuration, operation, etc., which have been described hitherto, illustrate one embodiment of the invention, and the invention are not limited to the above configuration, operation, etc.

INDUSTRIAL APPLICABILITY

According to a screen printing apparatus and a screen printing method of the invention, since the ascending stroke is shortened at the time of the position alignment by reducing the clearance between a substrate and a mask at the time of the position recognition, the invention has an advantage that it is possible to suppress the reduction of the position alignment accuracy of a substrate and a mask and is useful in a field of a screen printing of printing a pattern with paste on the surface of a substrate aligned with a mask in which predetermined pattern openings are formed.

The invention claimed is:

1. A screen printing apparatus which prints a pattern with paste on a surface of a substrate aligned with a mask in which predetermined pattern openings are formed, the apparatus comprising:
    a substrate holding device holding the substrate;
    a substrate moving device moving the substrate held on the substrate holding device and aligning the substrate with the mask;
    a recognition device recognizing a first recognized part formed on the surface of the substrate and a second recognized part formed on a rear face of the mask; and
    a moving device advancing and retreating the recognition device between the substrate and the mask and horizontally moving the recognition device in a range including the first recognized part and the second recognized part,
    wherein the recognition device comprises includes a first recognition device which recognizes the first recognized part and a second recognition device which recognizes the second recognized part, the first recognition device and the second recognition device are at the same height and are in a plane parallel with the surface of the substrate, and the first and second recognition devices face opposite directions.

2. The screen printing apparatus according to claim 1, wherein the first recognition device and the second recognition device are offset in a direction perpendicular to a transfer direction of the substrate and face parallel directions in a plane perpendicular to the transfer direction.

3. The screen printing apparatus according to claim 1, wherein the first recognition device disposes a first light-receiving part toward the surface of the substrate and the second recognition device disposes a second light-receiving part toward the rear face of the mask.

4. The screen printing apparatus according to claim 1, wherein the first recognized part and the second recognized part are offset at positions corresponding to the first recognition device and the second recognition device by offsetting the substrate held on the substrate holding device and the mask at a time when the recognition device recognizes the first recognized part and the second recognized part.

5. The screen printing apparatus according to claim 1, wherein the substrate holding device comprises a pair of dampers.

6. The screen printing apparatus according to claim 5, wherein each of the dampers has at least one depressed part and a movable claw provided in the depressed part, the movable claw holding the substrate.

7. The screen printing apparatus according to claim 6, wherein the movable claw is composed of a flexible z-shaped member having a thickness of about 0.1 mm, the z-shaped member has an upper flat portion and a lower flat portion.

8. The screen printing apparatus according to claim 7, wherein the upper surface of the upper flat portion of the z-shaped member is disposed on the same level of the upper surface of the substrate.

9. The screen printing apparatus according to claim 8, wherein the substrate moving device comprises an actuator provided inside of each damper, the actuator comprises a driving part and a movable part, the lower flat portion of the z-shaped member is attached to the movable part of the actuator, and the driving part moves the movable part and the movable claw horizontally.

10. The screen printing apparatus according to claim 9, wherein the upper flat portion of the movable claw moves to project above the substrate when a high degree of printing precision is not required, and the upper flat portion of the movable claw moves to not project above the substrate when a high degree of printing precision is required.

11. The screen printing apparatus according to claim 10, wherein the substrate holding device further comprises a spacer supporting the substrate, and when the upper flat portion of the movable claw is not projected above the substrate, the substrate is attracted toward the spacer, thereby preventing dropout of the substrate.

12. The screen printing apparatus according to claim 1, wherein the screen printing apparatus further comprises an opening as a passage for the substrate, an upper shutter provided on an upper portion of the opening, and a lower shutter provided on a lower portion of the opening.

13. The screen printing apparatus according to claim 12, wherein the upper shutter moves in up and down directions to narrow the upper portion of the opening to such a degree that the substrate can pass through the opening, and the lower shutter moves in up and down directions to narrow the lower portion of the opening to such a degree that the substrate can pass through the opening.

14. The screen printing apparatus according to claim 13, wherein the upper shutter comprises a first sensor hole and the lower shutter comprises a second sensor hole, the first and second sensor holes receive a sensor light, and when a foreign object approaches the opening and intersects the sensor light or contacts the upper or lower shutter to move them in the up and down directions, the screen printing apparatus is stopped.

15. The screen printing apparatus according to claim 1, wherein the first recognition device and the second recognition device face perpendicular to the plane parallel with the surface of the substrate.

16. A screen printing method of printing a pattern with paste on a surface of a substrate aligned with a mask in which predetermined pattern openings are formed, the method comprising the steps of:
    advancing and retreating a recognition device comprising a first recognition device and a second recognition device arranged in parallel between the substrate and the mask and are at the same height and offset in a plane parallel with the surface of the substrate; and
    horizontally moving the recognition device in the range including a first recognized part formed on the surface of the substrate and a second recognized part formed on a rear face of the mask,
    wherein the first and second recognition device face opposite directions, and the first recognition device recognizes the first recognized part and the second recognition device recognizes the second recognized part.

17. The screen printing method according to claim 16, wherein the first recognized part and the second recognized part are offset at positions corresponding to the first recognition device and the second recognition device by offsetting the substrate held on the substrate holding device and the mask at a time when the recognition device recognizes the first recognized part and the second recognized part.

* * * * *

UNITED STATES PATENT AND TRADEMARK OFFICE
CERTIFICATE OF CORRECTION

PATENT NO. : 7,908,964 B2
APPLICATION NO. : 12/090653
DATED : March 22, 2011
INVENTOR(S) : Kimiyuki Yamasaki et al.

It is certified that error appears in the above-identified patent and that said Letters Patent is hereby corrected as shown below:

On the following pages of the issued patent, please delete the word "dampers" and instead insert --clampers--.

In column 4, lines 59, 60, 63, 64, 67
In column 5, lines 28, 49, 50, 63, 67
In column 6, lines 7, 9, 24, 28, 30, 49, 58
In column 7, lines 8, 16, 18, 26, 35, 50
In column 8, line 22
In column 12, lines 15 and 36
In column 13, lines 8, 30, 39
In column 14, lines 54 and 67

Signed and Sealed this
Twenty-sixth Day of July, 2011

David J. Kappos
*Director of the United States Patent and Trademark Office*